US011360121B2

(12) United States Patent
Sridharan et al.

(10) Patent No.: US 11,360,121 B2
(45) Date of Patent: Jun. 14, 2022

(54) SYSTEM AND METHOD FOR ENERGY SENSING AND HARVESTING WITH FAULT DETECTION

(71) Applicant: Johnson Controls Tyco IP Holdings LLP, Milwaukee, WI (US)

(72) Inventors: Ashok Sridharan, Tamil Nadu (IN); Hariprasath Muthumanickam, Tamil Nadu (IN); Sushilkumar Madhukar Pagar, Pune (IN); Atul Dinesh Shukla, Maharashtra (IN); Hariharasudhan Venugopal, Chennai (IN); Ankur Thareja, Rajasthan (IN)

(73) Assignee: JOHNSON CONTROLS TYCO IP HOLDINGS LLP, Milwaukee, WI (US)

( * ) Notice: Subject to any disclaimer, the term of this patent is extended or adjusted under 35 U.S.C. 154(b) by 113 days.

(21) Appl. No.: 16/847,141

(22) Filed: Apr. 13, 2020

(65) Prior Publication Data
US 2020/0241051 A1 Jul. 30, 2020

Related U.S. Application Data

(63) Continuation of application No. PCT/US2018/055476, filed on Oct. 11, 2018, and a
(Continued)

(51) Int. Cl.
*G01R 15/20* (2006.01)
*H01F 38/30* (2006.01)
(Continued)

(52) U.S. Cl.
CPC ......... *G01R 15/202* (2013.01); *G01R 15/207* (2013.01); *G01R 21/133* (2013.01);
(Continued)

(58) Field of Classification Search
CPC ......... H04L 1/00; G05B 1/00; G05B 2219/00; G01R 1/00; H02H 1/00; H02J 1/00
See application file for complete search history.

(56) References Cited

U.S. PATENT DOCUMENTS 4,996,646 A * 2/1991 Farrington ............... H02H 3/00
700/293
9,379,556 B2 6/2016 Haensgen et al.
(Continued)

FOREIGN PATENT DOCUMENTS

| JP | H02-168173 | 6/1990 |
| JP | 2007-024824 A | 2/2007 |
| JP | 2011-122939 | 6/2011 |

OTHER PUBLICATIONS

International Search Report and Written Opinion for PCT Application No. PCT/US2018/055479, dated Jan. 2, 2019, 19 pages.
(Continued)

*Primary Examiner* — Jermele M Hollington
*Assistant Examiner* — Temilade S Rhodes-Vivour
(74) *Attorney, Agent, or Firm* — Foley & Lardner LLP

(57) ABSTRACT

A sensor for measuring current flow includes a power generation circuit, a current measurement circuit and a microcontroller. The power generation circuit includes a current transformer that harvests energy from a load applied to the conductor and uses the harvested energy to power the current measurement circuit and microcontroller. The current measurement circuit includes a Hall effect sensor that outputs a voltage signal in response to detecting a magnetic flux generated by the flow of current through the conductor. The microcontroller calculates a current measurement based on the voltage signal received from the current measurement system. The Hall effect sensor is able to generate the voltage signal used to measure current flow at the same time that the current transformer harvests energy from the current flowing
(Continued)

through the conductor. A fault detection system is able to alert a user to problems with the current transformer and/or the Hall effect sensor.

20 Claims, 17 Drawing Sheets

Related U.S. Application Data continuation of application No. PCT/US2018/055479, filed on Oct. 11, 2018, and a continuation of application No. PCT/US2018/055468, filed on Oct. 11, 2018.

(60) Provisional application No. 62/571,562, filed on Oct. 12, 2017.

(51) Int. Cl.
| | |
|---|---|
| H02J 50/00 | (2016.01) |
| H01F 38/28 | (2006.01) |
| H02J 50/10 | (2016.01) |
| G01R 21/133 | (2006.01) |
| H02M 3/22 | (2006.01) |
| H04L 67/12 | (2022.01) |

(52) U.S. Cl.
CPC .............. *H01F 38/28* (2013.01); *H01F 38/30* (2013.01); *H02J 50/001* (2020.01); *H02J 50/10* (2016.02); *H01F 2038/305* (2013.01); *H02M 3/22* (2013.01); *H04L 67/12* (2013.01)

(56) References Cited

U.S. PATENT DOCUMENTS

| | | | | |
|---|---|---|---|---|
| 9,698,767 | B2* | 7/2017 | Tuttle | ................. H03K 17/06 |
| 9,888,337 | B1 | 2/2018 | Zalewski et al. | |
| 10,295,575 | B2 | 5/2019 | Cheng et al. | |
| 2006/0076946 | A1 | 4/2006 | Shvach et al. | |
| 2008/0106241 | A1* | 5/2008 | Deaver | ................. H02J 3/1828 323/209 |
| 2009/0015239 | A1 | 1/2009 | Georgiou | |
| 2009/0243876 | A1 | 10/2009 | Lilien et al. | |
| 2010/0253318 | A1 | 10/2010 | Thomas, Sr. | |
| 2010/0264906 | A1 | 10/2010 | Shamir et al. | |
| 2012/0039062 | A1 | 2/2012 | McBee et al. | |
| 2012/0043889 | A1* | 2/2012 | Recker | ................... H05B 45/38 315/86 |
| 2013/0057997 | A1* | 3/2013 | Dent | ...................... G01R 31/42 361/118 |
| 2013/0191103 | A1 | 7/2013 | Chu et al. | |
| 2014/0200843 | A1 | 7/2014 | Shamir et al. | |
| 2015/0326136 | A1* | 11/2015 | Strzalkowski | ........ H02J 50/001 323/355 |
| 2016/0146856 | A1 | 5/2016 | Komiya | |
| 2019/0113546 | A1 | 4/2019 | Jain et al. | |

OTHER PUBLICATIONS

International Search Report and Written Opinion on PCT/US2018/055468, dated Jan. 2, 2019, 6 pages.
International Search Report and Written Opinion Received for PCT Application No. PCT/US2018/055452, Johnson Controls Technology Company, dated Jan. 3, 2019, 66 pages.
International Search Report and Written Opinion Received for PCT Application No. PCT/US2018/055476, Johnson Controls Technology Company, dated Jan. 2, 2019, 6 Pages.
Kiyonori et al., Translation of Japanese Patent Document 2011-122939 A; Jun. 23, 2011; Translation by Google & EPO (Year: 2011).
Non-Final Office Action on U.S. Appl. No. 16/157,759 dated Apr. 1, 2020.

* cited by examiner

SYSTEM AND METHOD FOR ENERGY SENSING AND HARVESTING WITH FAULT DETECTION

CROSS-REFERENCE TO RELATED PATENT APPLICATIONS

This application is a continuation of Patent Cooperation Treaty (PCT) Application Nos. PCT/US2018/055476, PCT/US2018/055479, and PCT/US2018/055468, each filed Oct. 11, 2018, and each of which claims the benefit of and priority to U.S. Provisional Patent Application No. 62/571,562, filed Oct. 12, 2017. The entire disclosures of each of the foregoing applications are incorporated by reference herein.

BACKGROUND

The present disclosure relates generally to an energy management system for a building and more particularly to an energy monitoring system which transmits measurements from a wireless sensor to a gateway (collector) and ultimately to a server. The data from the wireless sensor can be analyzed and integrated with various systems to optimize a set of control decisions made by the control system.

The main assets of a building control system typically include HVAC equipment such as chillers, condensers, fans, rooftop units, etc. The operation of this equipment often requires large amounts of power. It is desirable to know the power consumption of the entire building (i.e., the main load) but additional optimization can be achieved with knowledge of the power consumption of smaller sets of equipment within the building. One technique for determining the power consumption of smaller sets of equipment is often referred to as submetering and requires a disruptive, expensive, and time-consuming installation process. More recent approaches involve wired energy sensors or battery-powered wireless sensors that require maintenance.

SUMMARY

Another implementation of the present disclosure is an apparatus including an energy harvesting element, a sensing element, a fault detecting circuit, and a microcontroller. The energy harvesting element is configured to mount around a power line and harvest energy in response to a load being applied to the power line. The sensing element is configured to generate a signal in response to a load being applied to the power line and to generate no signal in response to no load being applied to the power line. The fault detecting circuit is configured to generate an output based on the signal generated by the sensing element. The output generated by the fault detecting circuit corresponds to an offset version of the signal generated by the sensing element, such that, in response to no load being applied to the power line, the output generated by the fault detecting circuit corresponds to a non-zero offset reading. The microcontroller is configured to calculate a reading of current flow through the power line based on the signals generated by the sensing element. At least one of the sensing element and the microcontroller is powered entirely and exclusively by energy harvested by the harvesting element.

In some embodiments, the signal generated by the sensing element is representative of a magnetic field generated by a load being applied to the power line. In some embodiments, the signal is a voltage signal. In some embodiments, the sensing element is a Hall effect sensor.

In some embodiments, a housing is configured to be attached about a power line. The energy harvesting element, the sensing element, and the fault detecting circuit and the microcontroller are each contained entirely within the housing.

In some embodiments, the fault detecting circuit is configured to generate an alarm if the output generated by the fault detecting circuit is less than the non-zero offset reading. In some embodiments, the sensing element and the microcontroller are each powered exclusively and entirely by energy harvested by the energy harvesting element.

Another implementation of the present disclosure is a sensor including a housing, a power generation circuit, a current measurement circuit, and a processor. The housing is configured to be positioned about a power line. The power generation circuit is configured to harvest energy from the power line in response to a load applied to the power line. The current measurement circuit is configured to detect a load applied to the power line and generate a signal corresponding to the detected load. The generated signal is offset from the detected load by a predetermined non-zero amount, such that when no load is applied to the power line, the signal generated by the current measurement circuit corresponds to a non-zero offset reading. The processor is configured to calculate current flowing through the power line based on the signal generated by the current measurement circuit. An energy harvesting element of the power generation circuit, a sensing element of the current measurement circuit and the processor are each entirely contained within the housing.

In some embodiments, the energy harvesting element includes a current transformer. In some embodiments, the sensing element is configured to detect a magnetic field generated by a load being applied to the power line. In some embodiments, the sensing element includes a Hall effect sensor.

In some embodiments, a capacitor is stored within the housing. The capacitor is configured to store energy harvested by the harvesting element.

In some embodiments, an alarm is configured to generate a current measurement warning if the signal generated by the current measurement circuit is less than the non-zero offset reading. In some embodiments, the power generation circuit is configured to generate an alarm in response to detecting no energy being harvested by the harvesting element and in response to determining that the signal generated by the current measurement circuit is greater than or equal to the non-zero offset reading.

Another implementation of the present disclosure is a method for measuring current flow through a conductor. A harvesting element is utilized to non-invasively harvest energy from a conductor to which a load has been applied. A sensing element is utilized to non-invasively generate a signal responsive to the load applied to the conductor. The sensing element is configured to generate a non-zero offset reading in response to no load being applied to the conductor. A first alarm is generated in response to the sensing element generating a signal that is less than the non-zero offset reading. A second alarm is generated in response to no energy being harvested by the harvesting element and a generated sensing element signal that is greater than or equal to the non-zero offset reading. If no first alarm is generated, a microcontroller processes the signal generated by the sensing element to determine current flow through the conductor.

In some embodiments, at least a portion of the energy harvested by the harvesting element is stored within a capacitor operably connected to the harvesting element. In some embodiments, the signal generated by the sensing element is based on the measurement of a magnetic field resulting from the load applied to the conductor. In some embodiments, the harvesting element includes a current transformer and the sensing element includes a Hall effect sensor. In some embodiments, the current transformer, the Hall effect sensor and the microcontroller are each entirely contained within a sensor housing configured to be placed around the conductor. In some embodiments, the Hall effect sensor and the microcontroller are each powered entirely and exclusively by the energy harvested by the current transformer.

One implementation of the present disclosure is an apparatus including an energy harvesting element, a sensing element, and a microcontroller. The energy harvesting element is configured to mount around a power line and harvest energy in response to a load being applied to the power line. The sensing element is configured to generate a signal in response to a load being applied to the power line. The sensing element is discrete from the energy harvesting element. The sensing element is configured to generate a signal in response to the load being applied to the power line at the same time that the energy harvesting element harvests energy in response to the applied load. The microcontroller is configured to calculate a reading of current flow through the power line based on the signals generated by the sensing element. At least one of the sensing element and the microcontroller is powered entirely and exclusively by energy harvested by the harvesting element.

In some embodiments, the signal generated by the sensing element is representative of a magnetic field generated by a load being applied to the power line. In some embodiments, the signal is a voltage signal. In some embodiments, the sensing element is a Hall effect sensor. In some embodiments, the energy harvesting element comprises a current transformer.

In some embodiments, a housing is configured to be attached about a power line. The energy harvesting element, the sensing element and the microcontroller are each contained entirely within the housing. In some embodiments, a capacitor is contained within the housing. The capacitor is configured to store energy harvested by the energy harvesting element. In some embodiments, the sensing element and the microcontroller are each powered exclusively and entirely by energy harvested by the energy harvesting element.

Another implementation of the present disclosure in a sensor including a housing, a power generation circuit, a current measurement circuit and a processor. The housing is configured to be positioned about a power line. The power generation circuit is configured to harvest energy from the power line in response to a load applied to the power line. The current measurement circuit is configured to generate a signal in response to the load applied to the power line. The processor is configured to calculate current flowing through the power line based on the signal generated by the current measurement circuit. The sensing element of the current measurement circuit is configured to generate the signal responsive to the load applied to the power line at the same time that a harvesting element of the power generation circuit harvests energy from the power line. The energy harvesting element, the magnetic field sensing element and the processor are each entirely contained with the housing.

In some embodiments, the energy harvesting element includes a current transformer. In some embodiments, the sensing element is configured to sense a magnetic field generated by a load being applied to the power line. In some embodiments, the sensing element includes a Hall effect sensor. In some embodiments, a capacitor is stored within the housing. The capacitor is configured to store energy harvested by the current transformer.

In some embodiments, the current measurement circuit and the processor are each powered exclusively and entirely by energy harvested by the power generation circuit. In some embodiments, at least one of the current measurement circuit and the processor are powered directly by the energy harvesting element.

Another implementation of the present disclosure is a method for measuring current flow through a conductor. A harvesting element is utilized to non-invasively harvest energy from a conductor to which a load has been applied. A sensing element is utilized to non-invasively generate a signal responsive to the load applied to the conductor at the same time that the harvesting element is used to harvest energy from the conductor. A microcontroller processes the signal generated by the sensing element to determine current flow through the conductor.

In some embodiments, at least a portion of the energy harvested by the harvesting element is stored within a capacitor operably connected to the harvesting element. In some embodiments, the signal generated by the sensing element is based on the measurement of a magnetic field resulting from the load applied to the conductor. In some embodiments, the harvesting element includes a current transformer and the sensing element includes a Hall effect sensor. In some embodiments, the current transform, the Hall effect sensor and the microcontroller are each entirely contained within a sensor housing configured to be placed around the conductor.

Another implementation of the present disclosure is an apparatus including a current transformer, a Hall effect sensor, and a microcontroller. The current transformer is configured to mount around a power line and harvest energy in response to a load being applied to the power line when the current transformer is mounted around the power line. The Hall effect sensor is configured to generate voltage signals in response to a load being applied to the power line. The microcontroller is configured to calculate a reading of current flow through the power line based on the voltage signals generated by the Hall effect sensor.

In some embodiments, the apparatus further includes a communications interface configured to transmit the current flow reading. In some embodiments, the Hall effect sensor is configured to generate signals at the same time that that the current transformer harvests energy.

In some embodiments, the apparatus further includes a housing configured to be attached about a power line. The current transformer, Hall effect sensor and microcontroller are contained entirely within the housing. In some embodiments, a capacitor configured to store energy harvested by the current transformer is further contained within the housing.

In some embodiments, at least one of the Hall effect sensor and microcontroller is powered exclusively and entirely by energy harvested by the current transformer.

Another implementation of the present disclosure is a sensor including a housing, a power generation circuit, a current measurement circuit and a processor. The housing is configured to be positioned about a power line. The power generation circuit is configured to harvest energy from the power line when the housing is positioned about the power line. The current measurement circuit is configured to generate a signal in response to a magnetic field generated by a load applied to the power line. The processor is configured to calculate current flowing through the power line based on the signal generated by the current measurement circuit. The power generation circuit includes an energy harvesting element configured to harvest energy. The current measurement circuit includes a magnetic field sensing element. The energy harvesting element, the magnetic field sensing element and the processor are each entirely contained with the housing.

In some embodiments, the energy harvesting element includes a current transformer. In some embodiments, the magnetic field sensing element includes a Hall effect sensor.

In some embodiments, the current measurement circuit is configured to generate an offset reading, such that when no current is flowing through the power line, the signal generated by the current measurement circuit corresponds to a non-zero voltage reading.

In some embodiments, the sensor further includes a capacitor configured to store energy harvested by the current transformer located within the housing.

In some embodiments, the current measurement circuit and the processor are each powered exclusively and entirely by energy harvested by the power generation circuit. In some embodiments, at least one of the current measurement circuit and the processor are powered directly by the energy harvesting element. In some embodiments, at least one of the magnetic field sensing element and the microcontroller are powered directly by the capacitor.

Another implementation of the present disclosure is a method for measuring current flow through a conductor. A current is induced in an energy harvesting element positioned about the conductor in response to current flow through the conductor. Energy is harvested using the induced current in the energy harvesting element. A magnetic flux sensing element is powered using the energy harvested by the energy harvesting element. A magnetic flux generated by current flow through the conductor is sensed using the magnetic flux sensing element. A microcontroller is powered using the energy harvested by the energy harvesting element. The microcontroller processes a signal generated by the magnetic flux sensing element in response to a sensed magnetic flux to determine current flow through the conductor.

In some embodiments, at least a portion of the energy harvested by the harvesting element is stored within a capacitor operably connected to the energy harvesting element.

In some embodiments, at least one of the magnetic flux sensing element and the microcontroller are powered directly by the energy harvesting element. In some embodiments, at least one of the magnetic flux sensing element and the microcontroller are powered directly by the capacitor.

In some embodiments, the energy harvesting element includes a current transformer. In some embodiments, the magnetic flux sensing element includes a Hall effect sensor.

DETAILED DESCRIPTION

Overview

Referring generally to the FIGURES, a building control system with one or more self-powered wireless smart energy sensors is shown, according to various exemplary embodiments. A smart energy sensor includes a snap on clip that can be used to attach the sensor to any primary conductor within a building control system. A primary conductor can be any conductor that provides electricity to a load. For example, a primary conductor can provide power to HVAC equipment, lighting fixtures, or any other electrical load within a building control system. A smart energy sensor can measure the current flowing through a primary conductor and transmit current measurements to a wireless gateway. Current measurement data can then be sent to cloud servers for further analytics and management. This data can be easily integrated with enterprise-level solutions such as a building management system (BMS). A smart energy sensor has two main functional components: an energy harvesting unit and a current measurement unit.

The energy harvesting unit may include electronic circuitry designed to generate energy from a current flowing through a primary conductor. A current transformer can be used to induce an electromotive force across the coils of the current transformer. The energy generated by the current transformer can be fed to the energy harvesting circuit to obtain a required energy level. The energy harvesting circuit can produce a constant output voltage that can be used to charge a super capacitor. The super capacitor can then distribute energy to the rest of the smart energy sensor.

The current measurement unit may include a Hall effect sensor and a microcontroller. The Hall effect sensor can output a voltage corresponding to a strength of a magnetic field created by a current flowing through a primary conductor. The strength of the magnetic field can later be translated into a current measurement. The sensor output signal can be conditioned and used as an input to a microcontroller. The microcontroller can contain an analog to digital converter used to sample the input signal. Samples can be stored in a memory and further processed according to logic stored in the microcontroller firmware. Samples can also be stored in a collector or gateway network. When the smart energy sensor has harvested enough power to do so, the current measurement data obtained from a primary conductor can be transmitted wirelessly via a communications interface.

Building HVAC Systems and Building Management Systems

Figure 1:
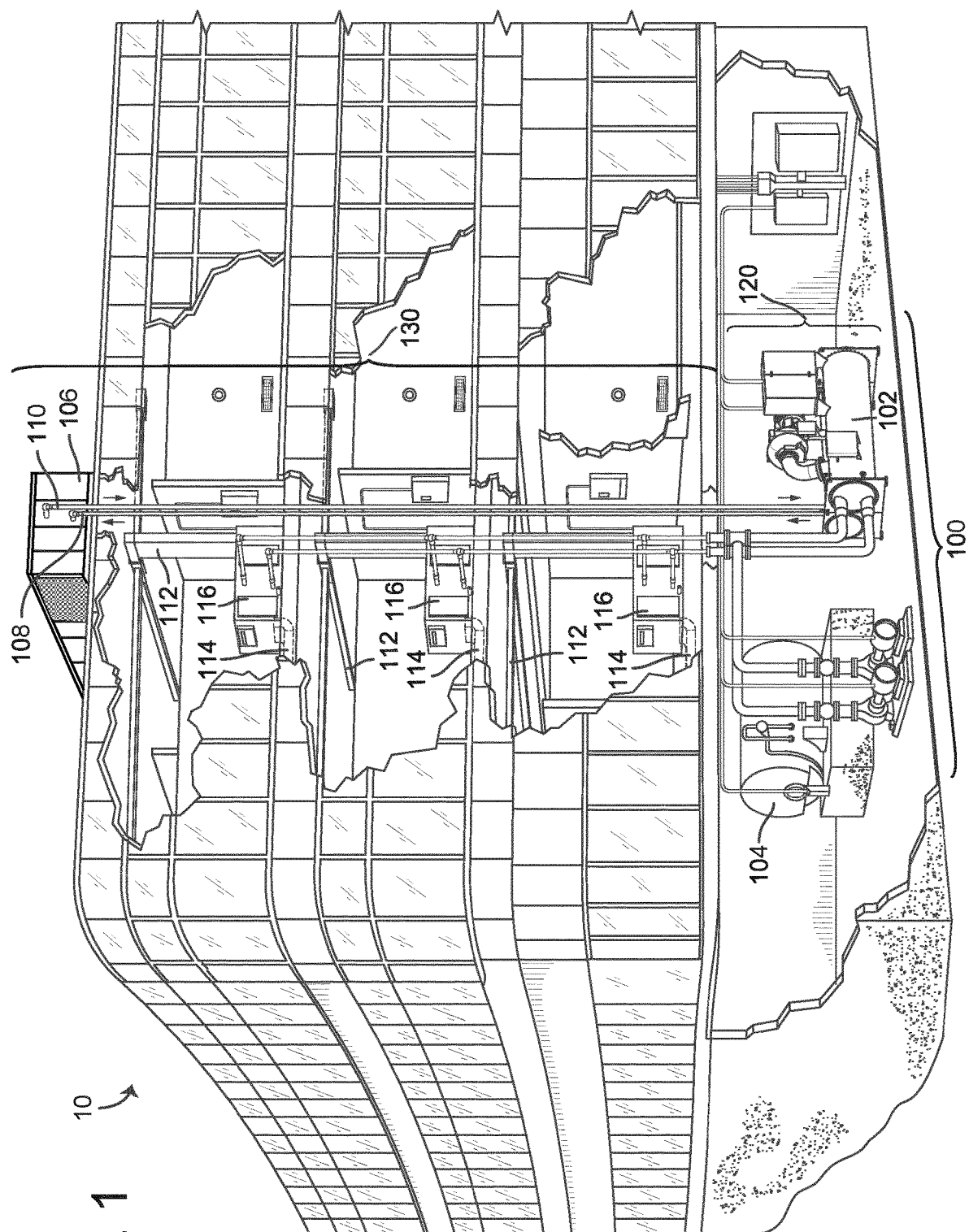
FIG. 1 is a drawing of a building equipped with a HVAC system, according to an exemplary embodiment.
Figure 2:
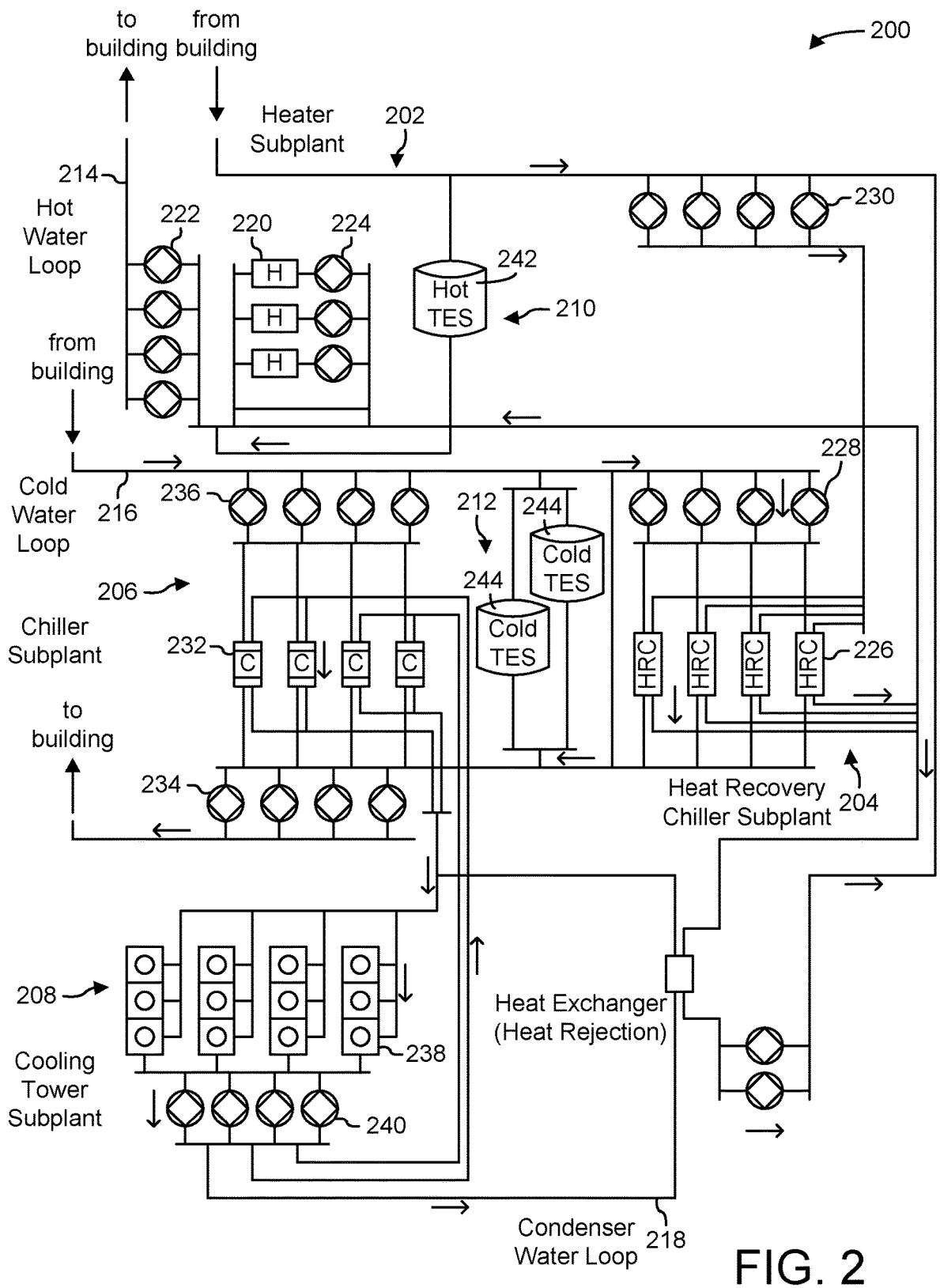
FIG. 2 is a block diagram of a waterside system that may be used in conjunction with the building of FIG. 1, according to an exemplary embodiment.
Figure 3:
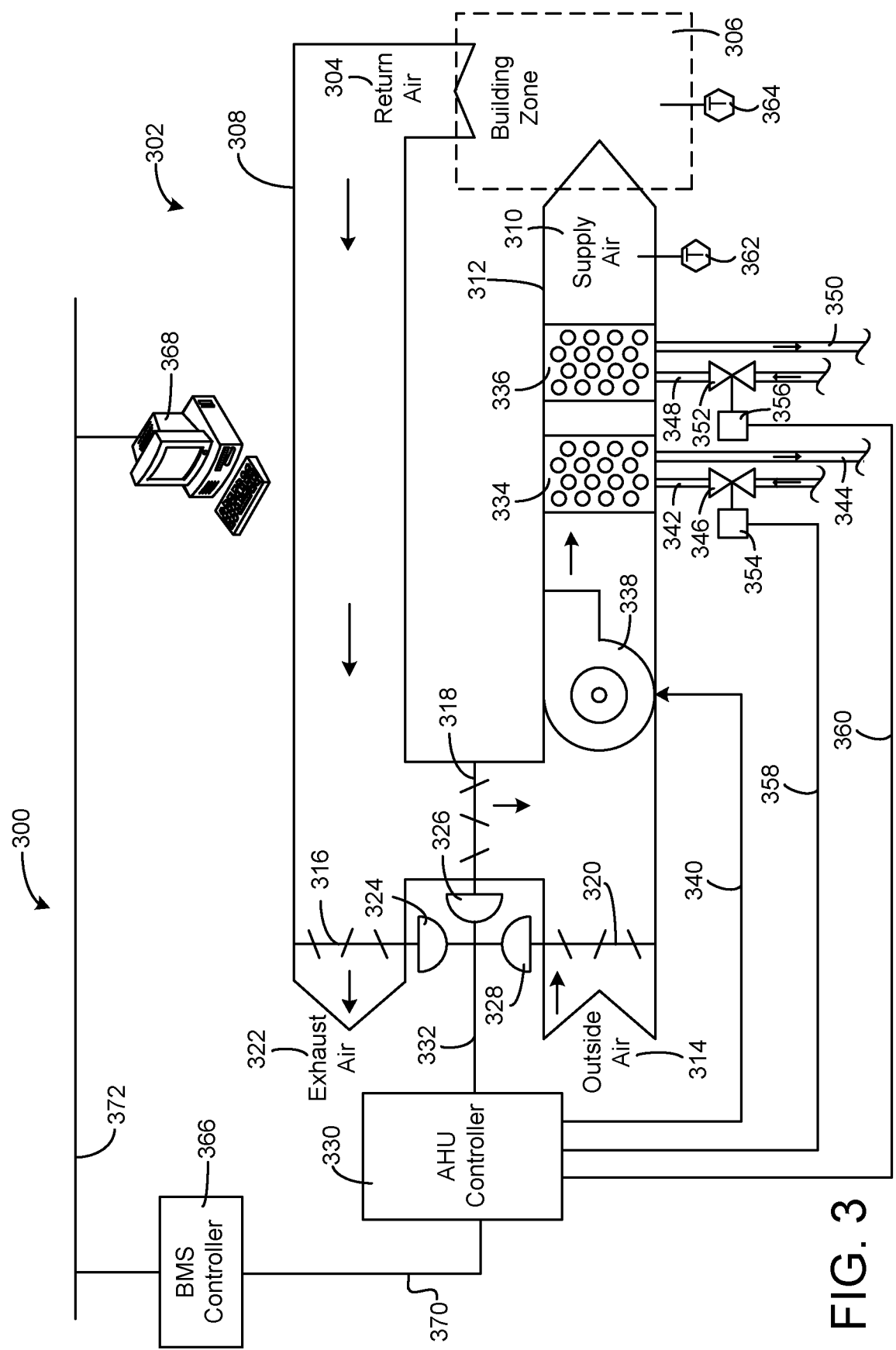
FIG. 3 is a block diagram of an airside system that may be used in conjunction with the building of FIG. 1, according to an exemplary embodiment.
Figure 4:
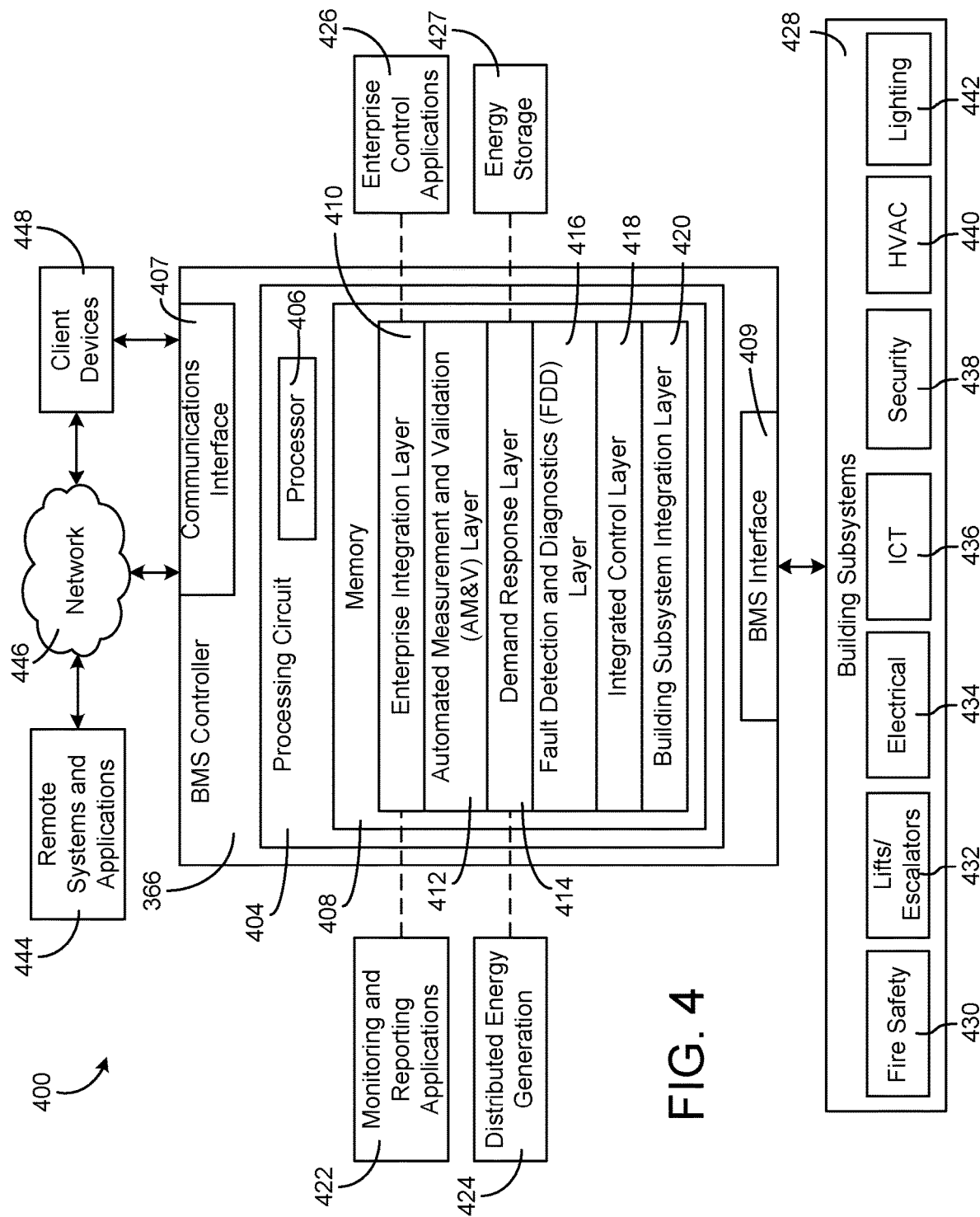
FIG. 4 is a block diagram of a building management system (BMS) which can be used to monitor and control the building of FIG. 1, according to an exemplary embodiment.
Figure 5:
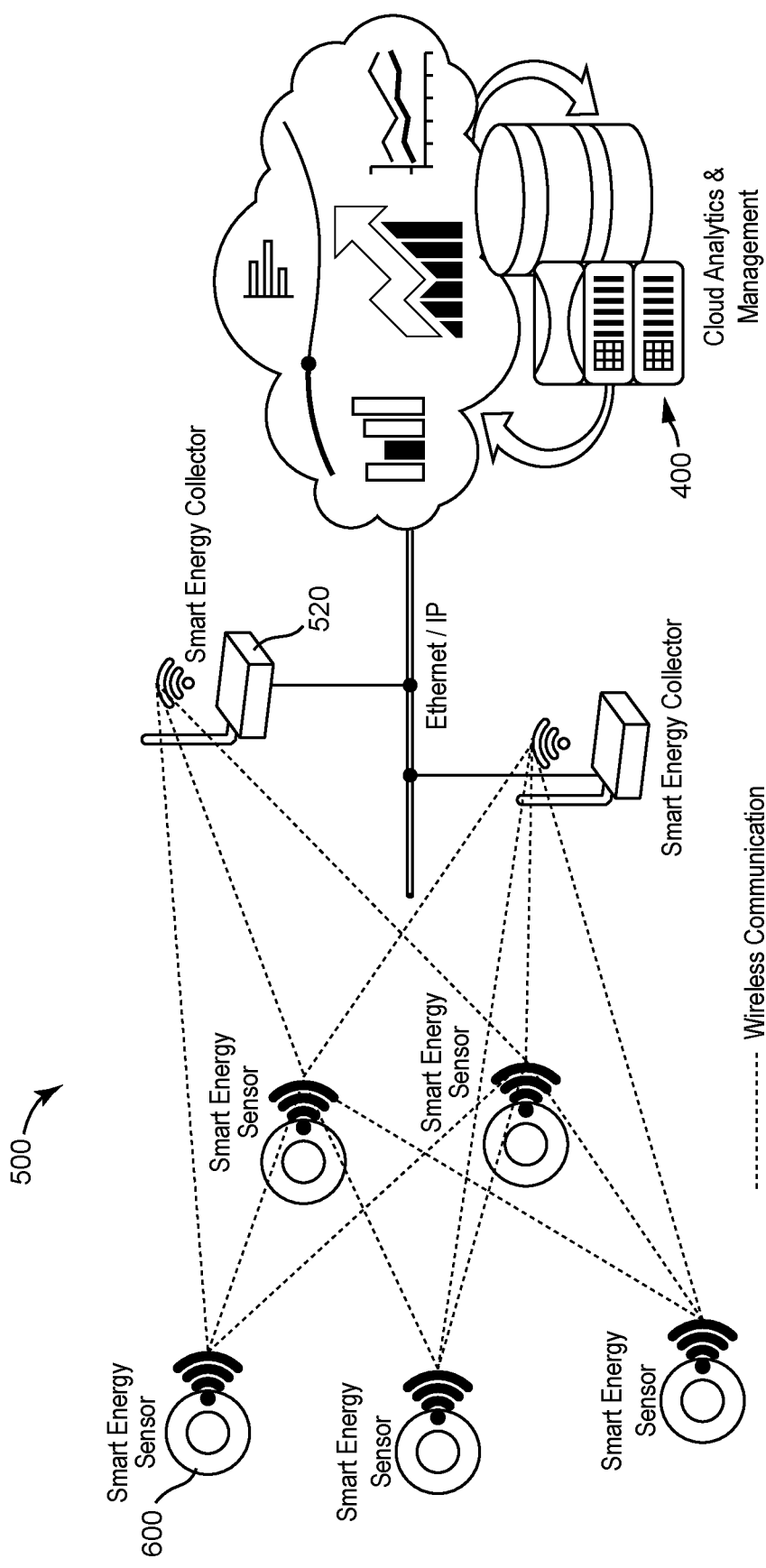
FIG. 5 is a diagram of a wireless sensor network architecture, according to an exemplary embodiment.

Referring now to FIGS. 1-5, several building management systems (BMS) and HVAC systems in which the systems and methods of the present disclosure can be implemented are shown, according to some embodiments. In brief overview, FIG. 1 shows a building 10 equipped with a HVAC system 100. FIG. 2 is a block diagram of a waterside system 200 which can be used to serve building 10. FIG. 3 is a block diagram of an airside system 300 which can be used to serve building 10. FIG. 4 is a block diagram of a BMS which can be used to monitor and control building 10. FIG. 5 is a block diagram of another BMS which can be used to monitor and control building 10.

Building and HVAC System

Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Waterside System

Referring now to FIG. 2, a block diagram of a waterside system 200 is shown, according to some embodiments. In various embodiments, waterside system 200 may supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and may operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Airside System

Referring now to FIG. 3, a block diagram of an airside system 300 is shown, according to some embodiments. In various embodiments, airside system 300 may supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 may communicate with an AHU controller 330 via a communications link 332. Actuators 324-328 may receive control signals from AHU controller 330 and may provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Building Management Systems

Referring now to FIG. 4, a block diagram of a building management system (BMS) 400 is shown, according to some embodiments. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to some embodiments, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translates communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In some embodiments, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to some embodiments, FDD layer 416 (or a policy executed by an integrated control engine or business rules engine) may shut-down systems or direct control activities around faulty devices or systems to reduce energy waste, extend equipment life, or assure proper control response.

FDD layer 416 can be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Smart Energy Sensor

Referring now to FIG. 5, a wireless sensor network 500 is shown, according to an exemplary embodiment. The network 500 is shown to include a plurality of smart energy sensors 600. These sensors 600 can be attached to any conductor within a building control system in order to obtain measurements of the current flowing through the conductor. The current measurements can be used to determine the power consumption of different equipment throughout the control system. For example, the network 500 of smart energy sensors 600 may be used to monitor the power consumption of HVAC equipment, lighting fixtures, and any other electrical loads that may be part of a building control system. The wireless smart energy sensors 600 provide an alternative to previous approaches to granular level load consumption monitoring such as submetering or battery powered energy sensors. The smart energy sensors 600 are easy to install, small in size, and require little to no maintenance.

According to various embodiments, the smart energy sensors 600 are entirely non-invasive, with installation of the sensor 600 requiring only that the smart energy sensor 600 be positioned about the conductor to be monitored, without requiring any wiring or other physical connection between the conductor and the sensor 600 in order to power the sensor 600 and/or to measure current flow through the conductor. As will be described in more detail below, according to various embodiments, the smart sensor 600 is entirely self-contained and self-powered, such that once the sensor 600 has been installed, no further interaction and/or additional components are required for the functioning on the sensor 600.

Sensor network 500 is shown to include a plurality of wireless gateways 520 used to collect data (e.g. current flow measurements) from the smart energy sensors 600. The gateways 520 can be connected over an Ethernet/IP network within a building control system. The gateways 520 can be configured to send data to cloud servers for further data management and analytics. The data can be used to optimize control decisions, allow for more efficient allocation of resources, schedule preventative maintenance, and reduce peak demand to name just a few examples. It should be noted that a plurality of smart energy sensors 600 can be connected in a network having any number of different topologies (e.g., star, mesh, etc.) to allow for sensor-to-sensor communication in addition to sensor-to-gateway communication. For example, in some embodiments, a star network may be used for direct communications between sensors 600 and gateways 520 and/or other collectors. In some embodiments, mesh networks may be used where communications between sensors 600 and gateways 520 and/or other collectors are not directly communicated, and instead are routed through one or more additional components (such as, e.g. a signal boosters, repeaters, etc.). Data provided by the smart energy sensors can be integrated with a building management system such as BMS 400 as well as various internet of things (IoT) applications. As will be understood, although the sensors 600 described herein are described as being used to measure current flow through the conductor, the smart sensor 600 may be used to provide any number of different readings, including e.g., voltage reading, etc.

Figure 6:
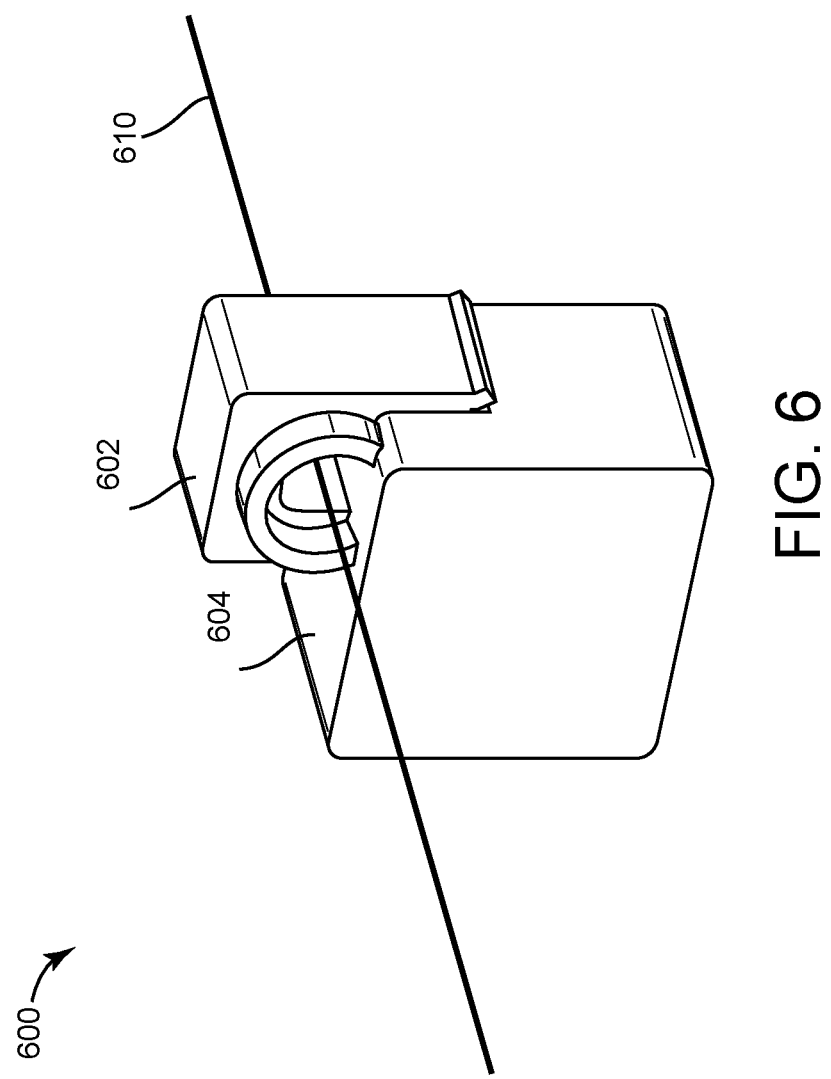
FIG. 6 is a mechanical representation of a smart energy sensor, according to an exemplary embodiment.

Referring now to FIG. 6, a mechanical representation of a smart energy sensor 600 is shown, according to an exemplary embodiment. The sensor 600 is shown to include a clip 602 that can be used to attach the sensor to a primary conductor 610. The term "primary conductor" will be used throughout this disclosure to reference a conductor 610 to which a smart energy sensor 600 is attached and from which smart energy sensor 600 obtains current measurements. The clip feature 602 allows for simple and fast installation of the sensor 600. The smart energy sensor 600 is also shown to include a housing 604 that encloses electronics used to power the sensor 600 and obtain and transmit current measurement data. Smart energy sensor 600 may be small enough in size to fit in the palm of a person's hand. According to various embodiments, the sensor 600, wireless sensor network 500, and/or any portion of the components defining the sensor 600 or wireless sensor network 500 described herein may include a sensor, wireless sensor network, and/or sensor or wireless sensor network component as described in U.S. patent application Ser. No. 16/157,759, filed Oct. 11, 2018 and titled "SELF-POWERED WIRELESS ENERGY SENSOR FOR EFFICIENT BUILDING MANAGEMENT," the entire disclosure of which is incorporated by reference herein.

Figure 7:
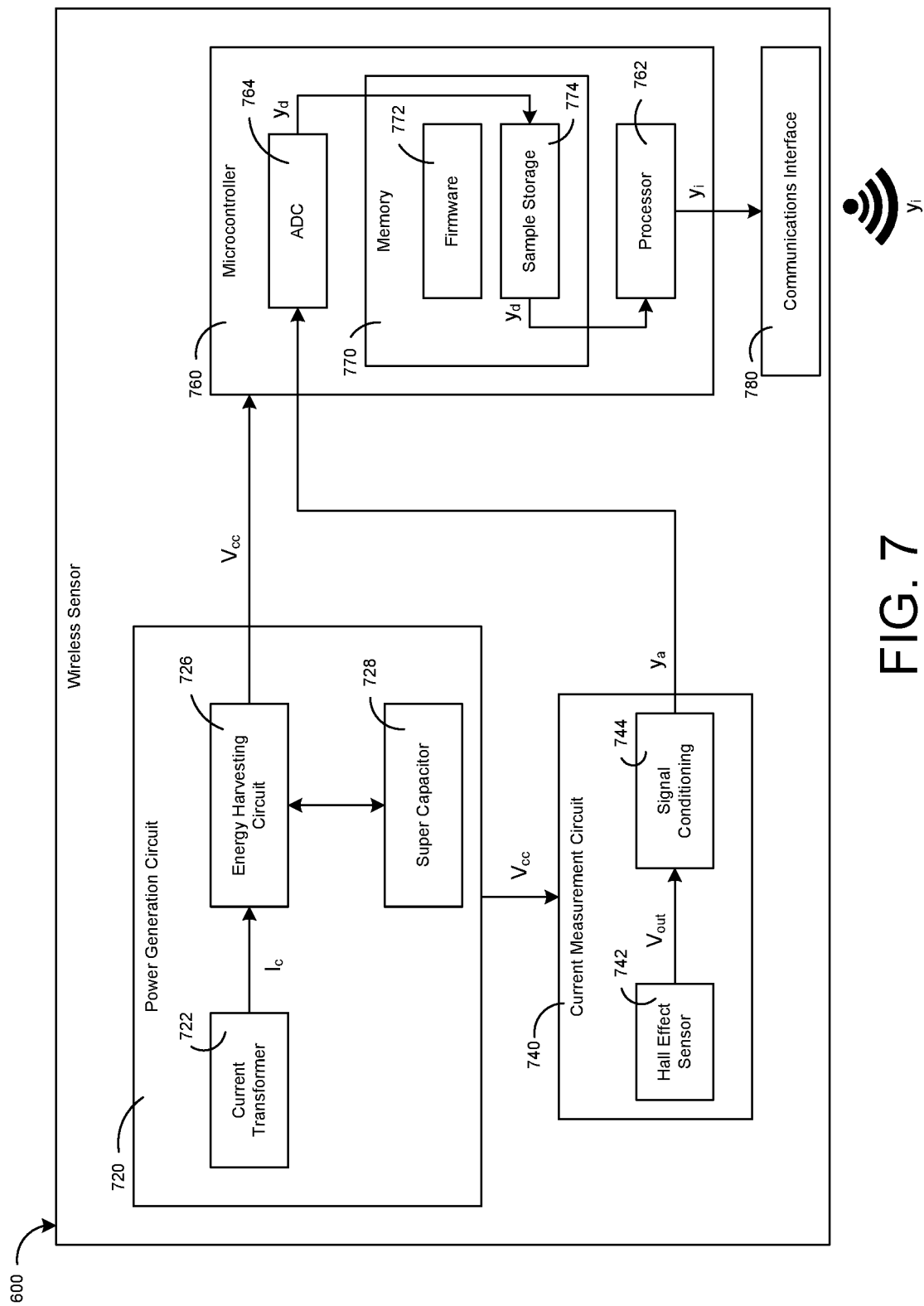
FIG. 7 is a block diagram of the major components of a smart energy sensor, according to an exemplary embodiment.

Referring now to FIG. 7, a block diagram of a smart energy sensor 600 configured to measure the current flow through a primary conductor 610 is shown according to an exemplary embodiment. As illustrated in FIG. 7, according to various embodiments, the sensor 600 includes a power generation circuit 720, a current measurement circuit 740, a microcontroller 760, and a communications interface 780.

Power generation circuit 720 is used to power the sensor 600. As will be understood, according to various embodiments, the power provided to the sensor 600 by the power generation circuit 720 may be obtained utilizing any number of energy sources. For example, according to some embodiments, the power generation circuit 720 may include a self-powered, non-invasive power source that is configured to power the sensor 600 using electromagnetic energy harvested from the conductor. This harvested energy may be used to produce a power signal $V_{cc}$ that can provide power to current measurement circuit 740 and microcontroller 760. According to various embodiments, the power generation circuit 720 may rely exclusively on electronic circuitry, without the need for any logic implementation and requisite software and/or firmware. According to some embodiments, the power generation circuit 720 may include a pre-charged battery configured to power the sensor 600.

According to some embodiments, the power generation (or energy harvesting), element of the power generation circuit 720 may comprise a current transformer 722 (such as, e.g. a split-core current transformer) capable of being placed around the primary conductor 610 with minimal disturbance. In some embodiments, the current transformer 722 is located in a clip 602 that attaches the smart energy sensor 600 to the primary conductor 610.

In embodiments in which the energy harvesting element comprises a current transformer 722, the current transformer 722 may comprise any number of different structures. According to various embodiments, the current transformer 722 may comprise a core formed of a low-loss magnetic material about which one or more coils are wound. The core includes a window through which the primary conductor 610 passes. As current flows through the primary conductor 610, a magnetic field circulating the conductor 610 is created. When the magnetic field interacts with the coil(s) of the current transformer 722, an electromotive force is induced across the coil(s). The energy produced as a result of this electromagnetic induction can be harvested and used to power the smart energy sensor 600.

As shown in FIG. 7, power generation circuit 720 includes an energy harvesting circuit 726 that is configured to harvest energy from a current $I_c$ input from the current transformer 722 to provide a stable power supply $V_{cc}$ for the elements of the sensor 600 (e.g. microcontroller 760, current measurement circuit 740, etc.) and/or to charge an optionally provided supercapacitor 728.

As will be understood, the energy harvesting circuit 726 may comprise any number of, and combination of, different components to provide an output voltage that may be used by the various components of the sensor 600. For example, according to various embodiments (such as, e.g., embodiments in which the sensor 600 is used in low-current applications), the energy harvesting circuit 726 may optionally include a step-up transformer that can boost a voltage signal produced by current transformer 722.

In some embodiments, the energy harvesting circuit 726 may optionally, or alternatively, also include one or both of a precision rectifier bridge and/or low-pass filter. When included, the precision rectifier bridge may be configured to convert a voltage signal generated in response to current flow through the conductor 610 from AC to DC. The optionally provided low-pass filter may be used to eliminate any undesirable signal content that may be present in the voltage signal, so as to allow the power generation circuit 720 to operate even while receiving "ultralow" voltage input signals, such as, e.g., signals as low as 20 mV.

In some embodiments, the energy harvesting circuit 726 may optionally, or alternatively, also include step-up DC-DC conversion and/or voltage regulation features. According to various embodiments, the energy harvesting circuit 726 may be configured to produce an output signal $V_{out}$ that can be a constant voltage such as 2.35V, 3.3V, 4.1V, 5V, etc. In some embodiments, a "power good" signal may be output by the energy harvesting circuit 726 to confirm whether the output signal is within a desired output voltage range.

As noted above, energy harvesting circuit 726 may any number of, and combination of, different components (e.g. step-up transformer; precision rectifier bridge, low-pass filter, voltage regulator, etc.). According to various embodiments, some, or all of, the individual components forming the power generation circuit 720 may be provided as separate, discrete components that are operably connected to one another to define the energy harvesting circuit 726 and which are provided within the housing 604 as operably connected, but discrete, components of the sensor 600. Alternatively, in other embodiments, each of the components forming the energy harvesting circuit 726 may be assembled together into a single, discrete, integrated energy harvesting circuit 726 component that is provided within the housing 604 as a single, discrete component of the sensor 600.

The voltage signal output by the energy harvesting circuit 726 may be used for a variety of applications, such as, e.g., providing a stable power supply $V_{cc}$ for powering the microcontroller 760 and/or the current measurement circuit 740. In some embodiments, the voltage signal output by the energy harvesting circuit 720 may additionally be used for charging rechargeable batteries, etc. which may, e.g., be used to provide a direct or reserve source of power for the microcontroller 760 and/or the current measurement circuit 740. As illustrated in FIG. 7, according to some embodiments, the power generation circuit 720 may include a "super capacitor" 728 that can be charged using the output signal $V_{out}$ produced by energy harvesting circuit 726. In some such embodiments, the super capacitor 728 may have a capacitance value as large as approximately 470 μF. The inclusion of such a super capacitor 728 may be advantageous, as the super capacitor 728 may allow for a faster delivery of stored energy and may have a higher tolerance for repeated charge/discharge cycles than, e.g., a rechargeable battery. Alternatively, in some embodiments, the super capacitor 728 may be used solely as an energy buffer that is configured to mitigate any surges or peaks in power so as to ensure a stable power supply $V_{cc}$ is provided to the microcontroller 760 and/or the current measurement circuit 740.

Accordingly, as will be understood, in embodiments in which the power generation circuit 720 includes a medium for storing harvested energy (e.g. a rechargeable battery, a super capacitor 728, etc.), the current measurement circuit 740 and/or microcontroller 760 may be powered using the energy harvested by the power generation circuit 720 in any number of different arrangements. For example, in some arrangement, one or both of the current measurement circuit 740 and/or microcontroller 760 may be powered directly by the voltage signal $V_{out}$ output by the energy harvesting circuit 720, with any excess voltage signal $V_{out}$ output by the energy harvesting circuit 720 optionally being stored in an optionally provided supercapacitor 728. In embodiments in which excess energy from the energy harvesting circuit 726 is stored within the supercapacitor 726, the stored energy $V_{bat}$ from the supercapacitor 728 may be provided directly to one or both of the current measurement circuit 740 and/or microcontroller 760, or may be provided indirectly (e.g. with the stored energy from the supercapacitor 728 being delivered to one or both of the current measurement circuit 740 and/or microcontroller 760 via the energy harvesting circuit 726). As noted above, in some embodiments in which the power generation circuit 720 includes a supercapacitor 728, the supercapacitor 728 may be configured solely as an energy buffer, with one or both of the current measurement circuit 740 and/or microcontroller 760 being powered exclusively by the energy harvesting circuit 726, despite energy being stored in the supercapacitor 728.

As noted above, in some embodiments the energy harvesting circuit 726 may be defined as a single, discrete integrated circuit component, while in other embodiments, the energy harvesting circuit 726 may be defined by a plurality of discrete components that are operably connected to one another. Similarly, as will be understood, according to various embodiments (such as, e.g. illustrated in FIG. 9A), some or all of the components of the power generation circuit 720 (e.g. current transformer 722, energy harvesting circuit 726, supercapacitor 728, etc.) may be provided as discrete components that are operably connected to define the power generation circuit 720 and which are provided within the housing 604 as operably connected, but discrete, components of the sensor 600. Alternatively, in other embodiments, each of the components forming the power generation circuit 720 may be assembled together into a single, discrete, integrated power generation circuit 720 component that is provided within the housing 604 as a single, discrete component of the sensor 600 (such as, e.g. illustrated in FIG. 9B).

Current measurement circuit 740 is configured to measure the current flowing through the conductor 610. As shown in FIG. 7, according to various embodiments, the current measurement circuit 740 is configured to produce a signal representative of a current measurement that can be sent to microcontroller 760 for processing and/or storage.

Conventional sensor arrangements configured to both measure current and harvest energy typically utilize a single current transformer ("CT") to both measure current flow through a conductor and to harvest energy from the conductor. Because a single CT is used for both functions, such conventional sensor arrangements are limited to being able to either measure current or harvest energy at a particular point in time. Thus, in order to harvest energy, any measuring of current by the CT of the conventional sensor arrangement must be interrupted. As a result of such discontinuities in the measuring of current flow using such conventional sensor arrangements, the ability of such conventional sensor arrangements to provide accurate and real-time current flow readings is diminished.

Accordingly, in various embodiments, such as, e.g., the sensor 600 embodiment illustrated in FIG. 7, the current measurement circuit 740 is advantageously configured to allow current flow through the conductor 610 to be measured at the same time that energy from the conductor 610 is being harvested by the power generation circuit 720, and vice versa. Such an arrangement of sensor 600 allows current to be measured continuously and uninterruptedly during operation of the sensor 600, thereby increasing the accuracy of the sensor 600 by allowing for instantaneous, real-time current measurements.

In some embodiments, the components defining the current measurement circuit 740 may be entirely discrete from the components of the power generation circuit 720, such that the power generation circuit 720 and current measurement circuit 740 are defined entirely independent and exclusive of one another. In other embodiments, despite being able to allow for the simultaneous harvesting of energy and measurement of current flow, the current measurement circuit 740 and power generation circuit 720 may comprise some of the same elements. For example, in embodiments of sensor 600 in which the current measurement circuit 740 includes a Hall effect sensor 742 and the power generation circuit 720 includes a current transformer 722, the core of the current transformer 722 and the flux concentrator of the Hall effect sensor 742 may comprise the same element.

As discussed above, the use of a single CT in conventional sensor arrangements to both harvest energy and measure current decreases the accuracy of current readings provided by such conventional sensor arrangements. The decreased ability of such conventional sensor arrangements to provide accurate current readings is further compounded as a result of the inefficiencies of using a CT to measure current.

More specifically, CTs exhibit low resolution and sensitivity when measuring current flow at low currents, with voltage output of the CT when sensing such low currents often being too low to be detected. In addition to the reduced ability of CTs to measure low current, CTs also become saturated at high currents, resulting in inaccurate high current measurements. Such non-linear excitation curves exhibited by CTs result in current measurements obtained using CTs exhibiting non-linear accuracy of the measurements, particularly in low and/or high current flow scenarios.

Further contributing to the inability of CTs to provide reliable and accurate current measurements is the effect that the alignment of a conductor within the CT core has on current measurements. In particular, although sufficient space between the exterior surface of the CT core and the interior surface of the CT core is needed to accommodate the conductor within the CT core interior and to minimize saturation, this spaced arrangement of the conductor within the CT core may cause slipping and misalignment of the conductor relative to the central axis of the CT core. Such misalignment of the conductor may result in non-linear current readings that do not accurately reflect current flow through the conductor.

Given the limitations of CTs to accurately measure current flow, according to various embodiments (e.g., such as illustrated in FIG. 7), the current measurement circuit 740 advantageously includes a Hall effect sensor 742 to measure current flow through the conductor 610. In contrast to CTs (which measure current flow by measuring the induced current in a winding surrounding the core of the CT), the Hall effect sensor 742 is configured to measure current flowing through the conductor 610 by measuring magnetic flux generated by the current flow through the conductor 610.

In particular, the Hall effect sensor 742 includes a flux concentrator core configured to focus magnetic flux lines generated by the current flow through the conductor 610 at a Hall sensing element that is positioned within a gap formed along the circumference of the flux concentrator core. The Hall sensing element is positioned within the gap in the flux concentrator core such that a flux-sensitive axis of the Hall sensing element is aligned substantially tangentially with respect to the magnetic field generated by the current flow through the conductor 610, so as to maximize the magnetic flux that is focused at the Hall sensing element by the flux concentrator core.

Although the Hall sensing element is advantageously aligned tangentially with respect to the generated magnetic field in order to maximize the magnetic flux concentrated at the Hall sensing element, in contrast to CTs (in which misalignment of the current transformer relative to the conductor results in inaccurate current readings) the Hall effect sensor 742 will provide the same voltage reading irrespective of the alignment of the Hall effect sensor 742 with respect to the conductor 610. Additionally, unlike the CTs used to measure current in conventional sensor arrangements (which only allow for an alternating current to be measured), the Hall effect sensor 742 of the sensor 600 allows for the measurement of both alternating and fixed current flow through the conductor 610.

According to various embodiments, the flux concentrator core is formed having a high magnetic permeability so as to increase the ability of the flux concentrator core to concentrate the small generated magnetic flux resulting from current flow through the conductor 610 onto the Hall sensing element, thereby making it possible for the Hall effect sensor 742 to provide more accurate readings. Advantageously, the ferromagnetic flux concentrator core is formed of materials defined by high linearity and low hysteresis. Non-limiting examples of materials that may be used for the flux concentrator core include NiFe 48%, NiFe 80%, a NiFe 48% and NiFe 80% combination, low-core loss SiFe, etc.

In addition to the uniform current readings that the Hall effect sensor 742 is able to provide regardless of possible slipping of the sensor 600 with respect to the conductor 610, the Hall effect sensor 742 used in the sensor 600 provides other advantages over the CTs used to measure current flow in conventional sensor arrangements. In particular, unlike CT-based current measuring devices, Hall effect sensors 742 are not impacted by transformer losses. Also, in contrast to the non-linear current measurement output of CTs used in conventional current sensor arrangements, the Hall effect sensor 742 of sensor 600 is configured to produce an output signal that correlates linearly to an applied magnetic flux density in response to both low and high current flow through the conductor 610. As such, unlike the issues of measuring low and high currents using a CT, with an appropriate flux concentrator design, the Hall effect sensor 742 may be configured to accurately measure current flow through a conductor 610 in a range from zero to hundreds of Amps.

According to various embodiments, the current measurement circuit 740 may optionally include a signal conditioning circuit 744 configured to reduce the noise content of the readings output by the current sensing element (e.g. Hall effect sensor 742) of the current measure circuit 740 in response to measuring a property related to current flow through the conductor 610. For example, in embodiments in which the current sensing element comprises a Hall effect sensor 742, the reading output comprises a voltage output reading $V_{out}$ corresponding to a magnitude of a magnetic field produced by a current through a primary conductor. According to some embodiments, the analog voltage output reading $V_{out\ may}$ range from between approximately 0V and approximately 2V.

The signal conditioning circuit 744 may be configured to amplify, filter, and/or otherwise manipulate of the output signal produced by the Hall effect sensor 742 or any other current sensing element forming a part of the current measurement circuit 740.

According to various embodiments, when provided, the optional signal conditioning circuit 744 configured to increase the signal-to-noise ratio of voltage output readings $V_{out\ obtained}$ using the Hall sensing element is provided as a component of the Hall effect sensor 742. In contrast, although conventional current sensor arrangements may include a signal conditioning circuit used to process CT current measurement signals, in such conventional sensor arrangements the signal conditioning circuit is provided as a discrete and separate element from the CT, leaving the current measurement signal output by the CT more prone to external electrical noise. Additionally, the current consumption of the separately provided signal conditioning circuit used in conventional sensor arrangements is greater than the current consumption of the signal condition circuit 744 that is provided as part of the Hall effect sensor 742.

As illustrated in FIG. 7, an input signal $y_a$ based on the reading output by the current sensing element of the current measurement circuit 740 (e.g. the voltage reading $V_{out}$ output by the Hall effect sensor 742) is sent to the microcontroller 760. In embodiments in which the input signal $y_a$ comprises an analog output, the microcontroller 760 may optionally include an analog-to-digital converter ("ADC") 764 configured to convert the analog input signal $y_a$ to a digital signal $y_d$ that can be used as an input to a processor 762 of the microcontroller 760. The ADC 764 may be configured can sample the input signal $y_a$ at a specified sampling rate (i.e., number of samples per second), with the output digital signal $y_d$ data optionally being stored in a sample storage 774 portion of memory 770. Although in some embodiments, such as, e.g., illustrated in FIG. 7, the ADC 742 may be formed as an integral part of the microcontroller 760, according to other embodiments, the ADC 764 may be provided as a discrete, separate component from the microcontroller 760.

Further referring to FIG. 7, according to various embodiments, microcontroller 760 includes a processor 762. The processor 762 may be configured execute the firmware logic 772 stored in microcontroller memory 770. According to some embodiments, the processor 762 can be a digital integrated circuit configured to accept binary data as an input (such as, e.g., output digital signal $y_d$ data that is stored in sample storage 774) and provide an output (such as, e.g. a current measurement signal $y_i$ in units of amperes) after processing the binary data according to firmware 772 logic. The processor 762 can contain combinational logic, sequential logic, and/or any other type of logic to process data. Although in some embodiments, such as, e.g., illustrated in FIG. 7, the processor 762 may be formed as an integral part of the microcontroller 760, according to other embodiments, the processor 762 may be provided as a discrete, separate component from the microcontroller 760.

As shown in FIG. 7, the sensor 600 further comprises a communications interface 780 configured to wirelessly transmit sensor data (such as, e.g., current measurement data $y_i$). The data transmitted by communication interface 780 can be received by a wireless gateway 520. In some embodiments, communications interface 780 is configured to transmit data over a Wi-Fi low power frequency band (e.g., 1-GHz/2.4-GHz). In other embodiments, communications interface 780 is configured to transmit data over a Sub-1-GHz frequency range (e.g., 434-MHz/900-MHz). The Sub-1-GHz frequency range for data transmission allows for long range communication, low power consumption and interference, and provides a high degree of compatibility with Internet of Things (IoT) and other enterprise-level applications. As will be understood, in other embodiments, any number of other wireless or wired communication methods (e.g. ZIGBEE, 6LOWPAN, BLE, etc.) may be used to transmit the sensor data. According to various embodiments, the communications interface 780 may be provided integrally with or discretely from the microcontroller 760.

As will be understood, in embodiments in which the ADC 764 and/or processor 762 is provided separate from the microcontroller 760 (and optionally separate from the sensor 600), the communications interface 780 may allow data such as, e.g. input signal $y_a$, output digital signal $y_d$ data, etc.) to be transmitted as needed for further processing to determine a current measurement signal $y_i$.

As noted above, according to various embodiments, the current sensing element of the current measurement circuit 740 may include a Hall effect sensor 742. As will be understood, Hall effect sensor 742 may comprise any number of different sensor arrangements, configurations, and/or structures that is activated by an external magnetic field (such as, e.g., resulting from the flow of current through a conductor 610) and which outputs a voltage as a function of the magnetic field density surrounding the sensor. In general, such Hall effect sensors 742 may be formed comprising a thin strip of semiconductor material (such as, e.g., gallium arsenide, indium antimonide, or indium arsenide, etc.). Exposure to an external magnetic field results in a potential difference being produced between the ends of the semiconductor strip, with the output voltage as measured between the ends of the strip being proportion to the strength of the magnetic field passing through the semiconductor material. According to various embodiments, the Hall effect sensor 742 may be configured to provide either linear (analogue) or digital output signals.

According to some embodiments, the Hall effect sensor 742 may include a DC amplifiers, logic switching circuit and/or voltage regulator built into the physical structure of the Hall effect sensor 742 itself. Such features may be configured to improve sensitivity, hysteresis and/or output voltage of the sensor, allowing the Hall effect sensor 742 to operate over a wider range of power supplies and magnetic field conditions. In other embodiments, such features may be provided as separate, discrete components that optionally form a part of the current measurement circuit. In embodiments in which such features are included, these features may be included as part of, in addition to, or in lieu of the signal conditioning circuit 744.

Although the current sensing element of the current measurement circuit 740 has been described above as comprising a Hall effect sensor 742, it is to be understood that, according to other embodiments, the current measurement circuit 740 may utilize any number of different current sensing elements to measure the current flowing through the conductor 610. As will be understood, even in such alternate embodiments in which a non-Hall effect sensor 742 sensing element is utilized, the current measurement circuit 740 is configured to allow for current to be measured simultaneously with the harvesting of energy using the power generation circuit 720.

Figure 8:
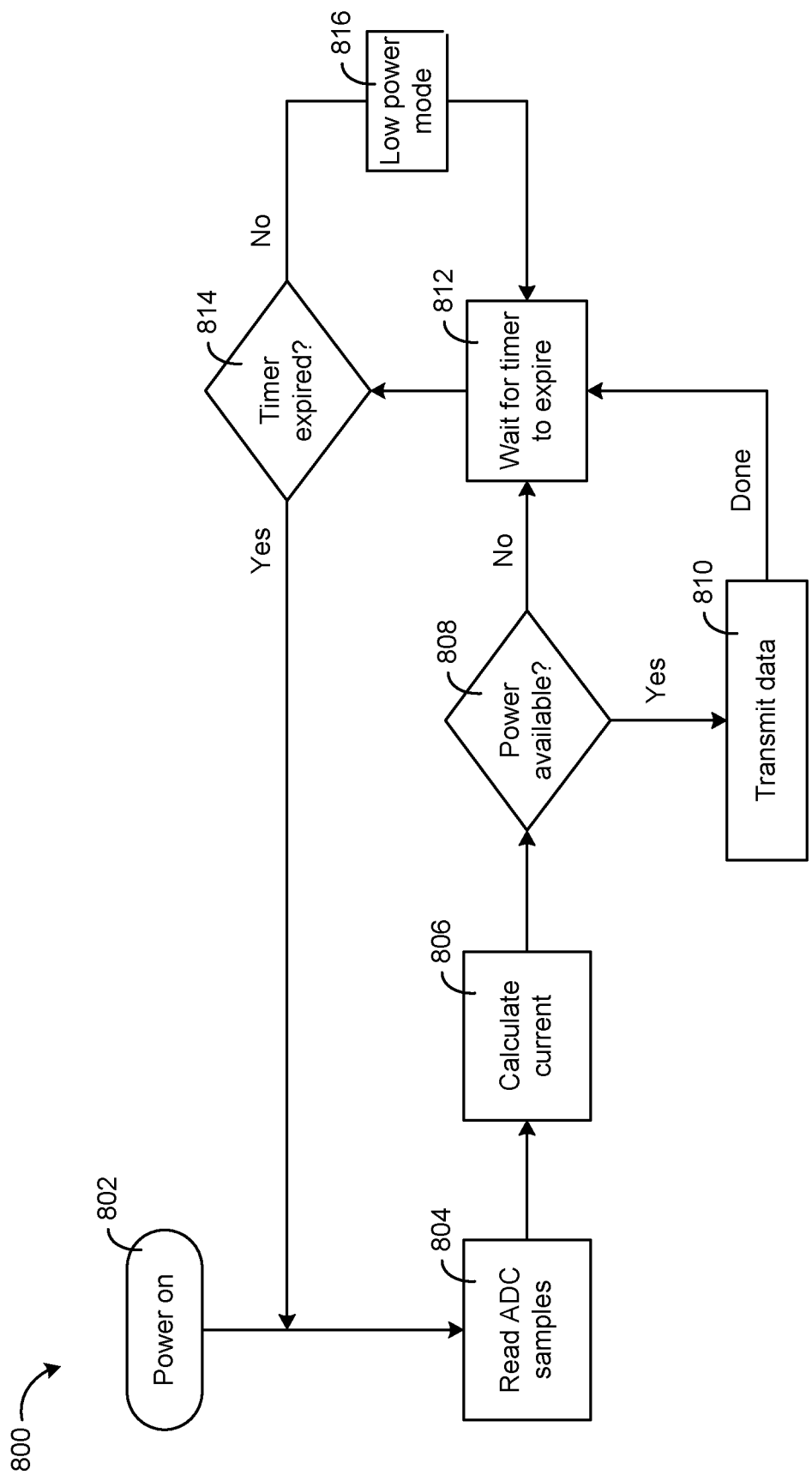
FIG. 8 is a state diagram describing the operation of a smart energy sensor, according to an exemplary embodiment.

Referring now to FIG. 8, a state diagram 800 describing the operation of a smart energy sensor 600 is shown, according to an exemplary embodiment. The state diagram can be a partial representation of firmware logic 772. State diagram 800 is shown to begin when the sensor 600 is powered on (step 802).

State diagram 800 is shown to include step 804 where a processor, such as processor 762, can read digital output signals $y_d$ produced by the ADC 764 based on the analog input signals $y_a$ received from the current measurement circuit 740. The digital output signals $y_d$ can be stored in a sample storage 744 of the memory 770 of the microcontroller 760 and read later by a processor 762.

State diagram 800 is shown to include step 806 where current measurement signals $y_i$ results are calculated based on the stored digital output signals $y_d$. The current measurement signals $y_i$ may be calculated by converting the digital output signals $y_d$ (which are based on voltage output readings $V_{out}$ obtained using the Hall effect sensor 742 to measure the magnitude of magnetic fields generated in response to current flow through the conductor 610) using appropriate arithmetic logic, lookup tables, etc. For example, a Hall effect sensor 742 voltage output reading $V_{out\ of}$ 1.09V may correspond to a magnetic field of 0.1 mT, which may in turn correspond to a primary conductor current of 5 A. Accordingly, in such a manner, the measured voltage may be used to determine a measured magnetic field magnitude, which can then be used to determine the magnitude of a current flowing through a primary conductor 610.

According to some embodiments, state diagram 800 may include a decision block 808 where the processor 762 determines if enough power is available to transmit current measurement signals $y_i$ using communications interface 780. In some embodiments, a "power good" signal output from power generation circuit 720 can be used to make this decision. In other embodiments, the processor 762 can be configured to read a voltage signal and determine whether sufficient power is available to transmit the current measurement signals $y_i$ wirelessly through the communications interface 780 (step 810).

State diagram 800 is shown to include step 812 where the sensor waits for a timer to expire. The sensor 600 either reaches this state after current measurement signals $y_i$ have been transmitted or if the microcontroller 760 determines there is not enough power available to transmit the current measurement signals $y_i$ (or other sensor 600 related data). In this state, the sensor 600 can run in low power mode (step 816) until the timer expires. Once the timer expires (step 814) the sensor 600 returns to step 804 where new digital output signals $y_d$ can be read by the microcontroller 760.

Figure 9A:
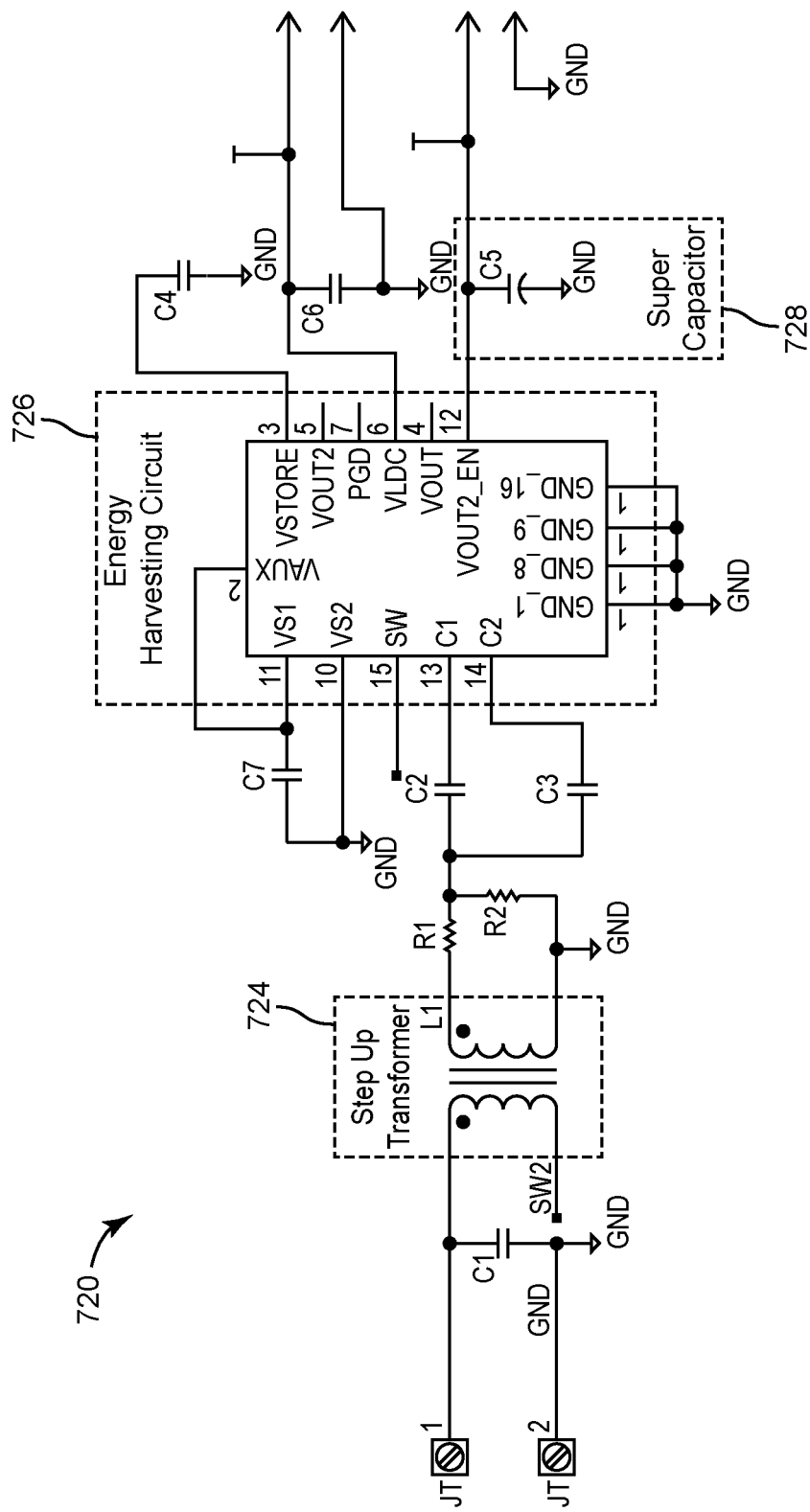
FIG. 9A is a schematic of some of the major components of a power generation circuit of a smart energy sensor, according to an exemplary embodiment.
Figure 9B:
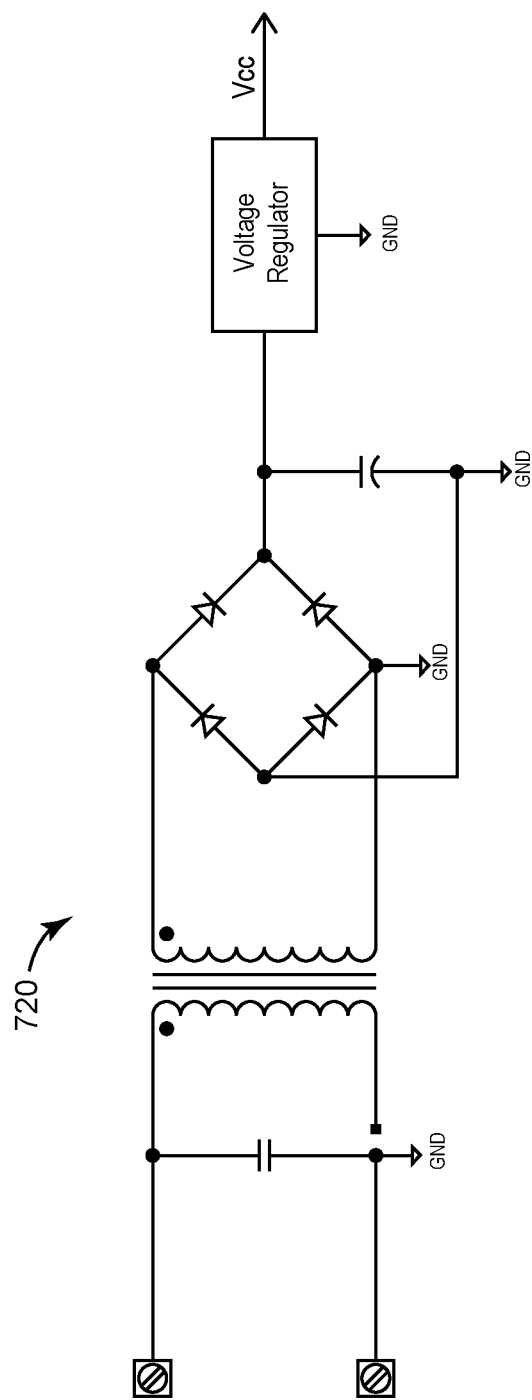
FIG. 9B is a schematic of some of the major components of a power generation circuit of a smart energy sensor, according to an exemplary embodiment.

Referring now to FIG. 9A, a schematic 900a of some of the major components of a power generation circuit 720 that can be included in a smart energy sensor 600 are shown, according to an exemplary embodiment. Schematic 900a, illustrated in FIG. 9A is shown to include a step-up transformer 724, an integrated energy harvesting circuit 726, and a super capacitor 728. As described above, the step-up transformer 724 can be used to boost the energy produced by a current transformer 722 of the power generation circuit 720. The integrated energy harvesting circuit 726 can be configured to receive a low input voltage and produce a constant output voltage used to charge a super capacitor 728. A super capacitor 728 can then be used to distribute power throughout a smart energy sensor 600. Referring to FIG. 9B, a schematic 900b of some of the major components of a power generation circuit 720 that can be included in a smart energy sensor 600 are shown, according to another exemplary embodiments.

Figure 10A:
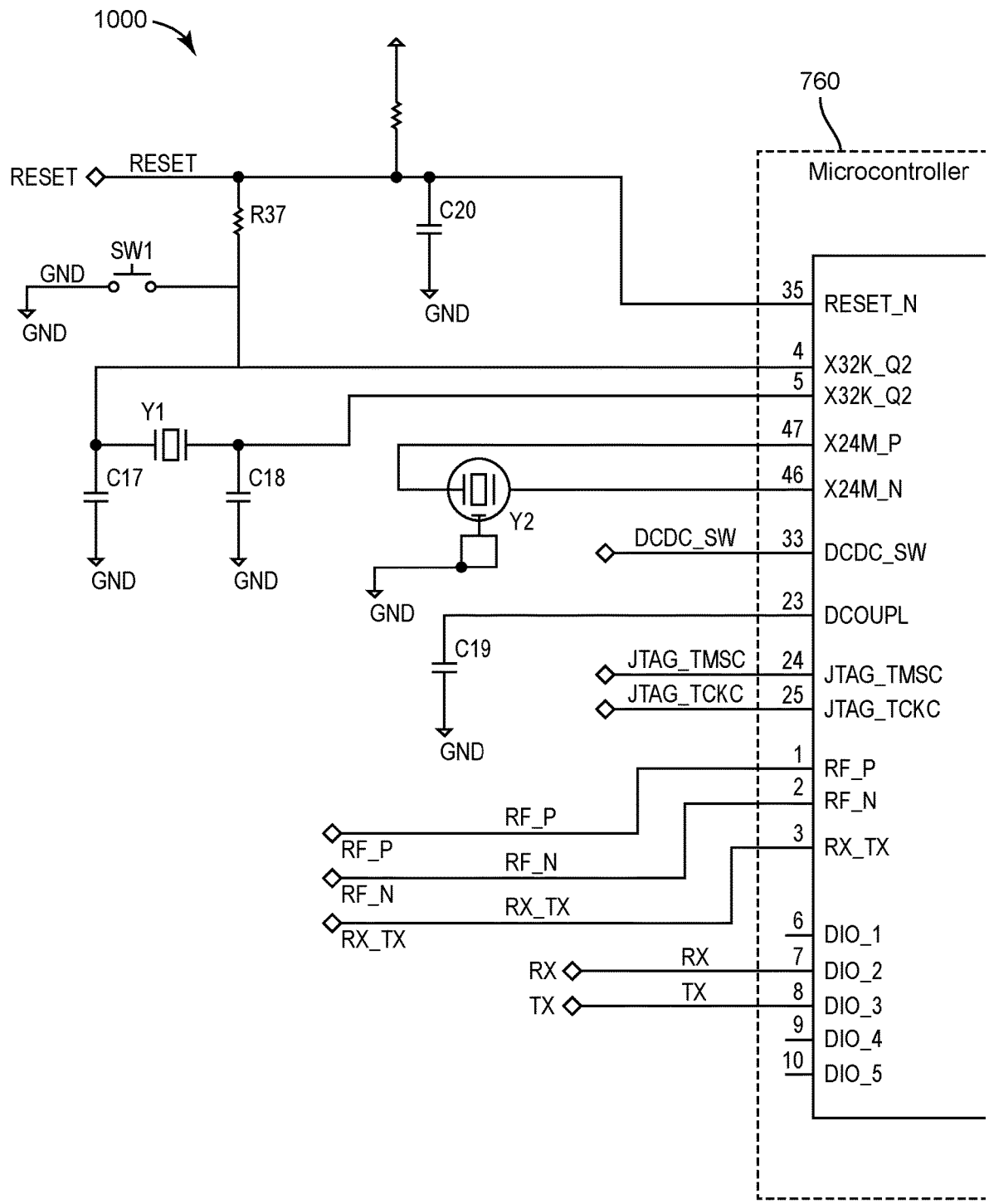
FIGS. 10A and 10B are a schematic of a microcontroller of a smart energy sensor, according to an exemplary embodiment.
Figure 10B:
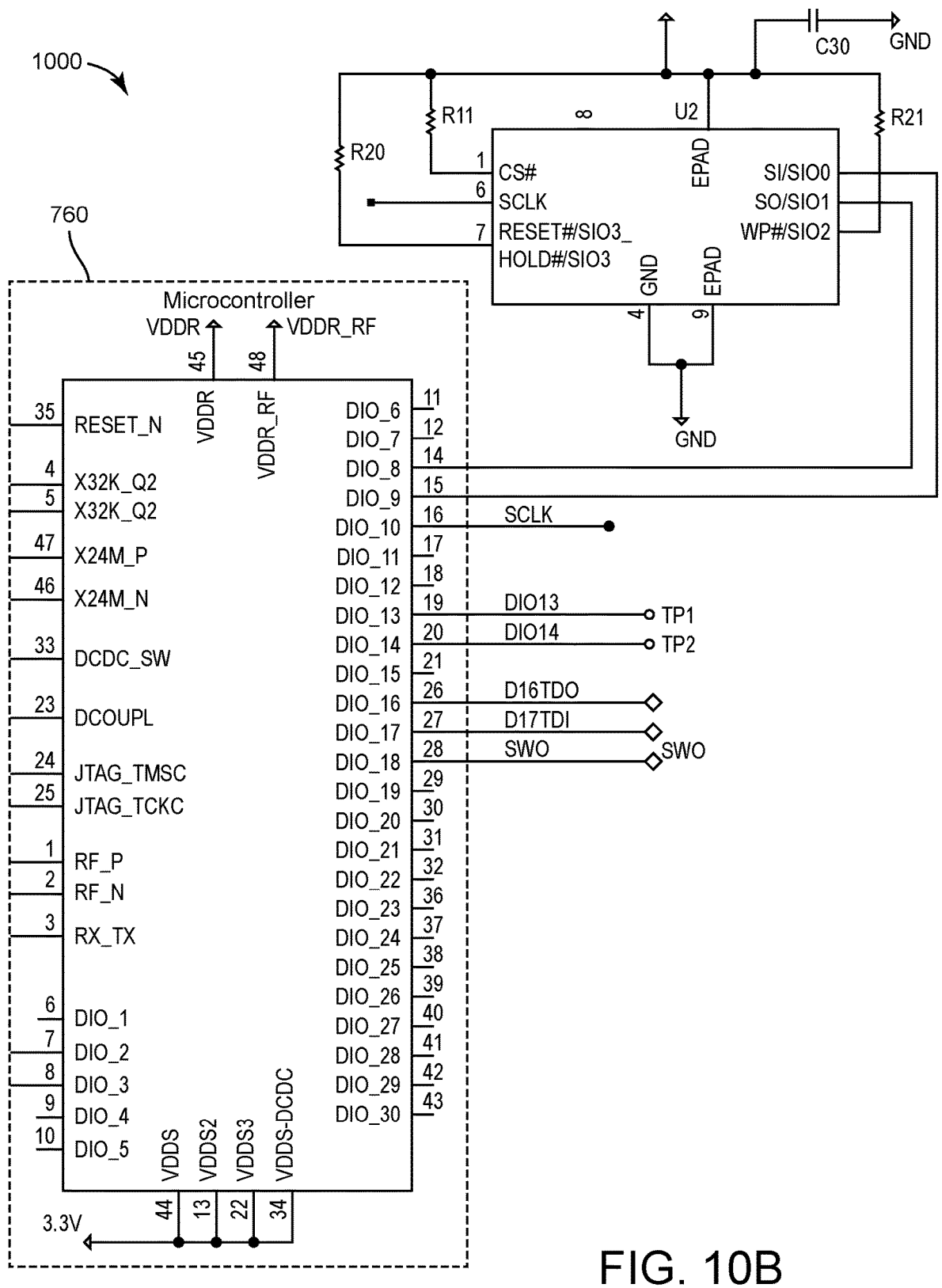

Referring now to FIGS. 10A and 10B, a schematic 1000 of a microcontroller 760 that can be included in a smart energy sensor 600 is shown, according to an exemplary embodiment. Schematic 1000 is shown to include a microcontroller 760 as well as various interconnections and components of the sensor 600. As described above, a microcontroller 760 can be used to process and store measurement data. The microcontroller can include a memory 770 and firmware 772 logic that controls the processing of data.

Figure 11:
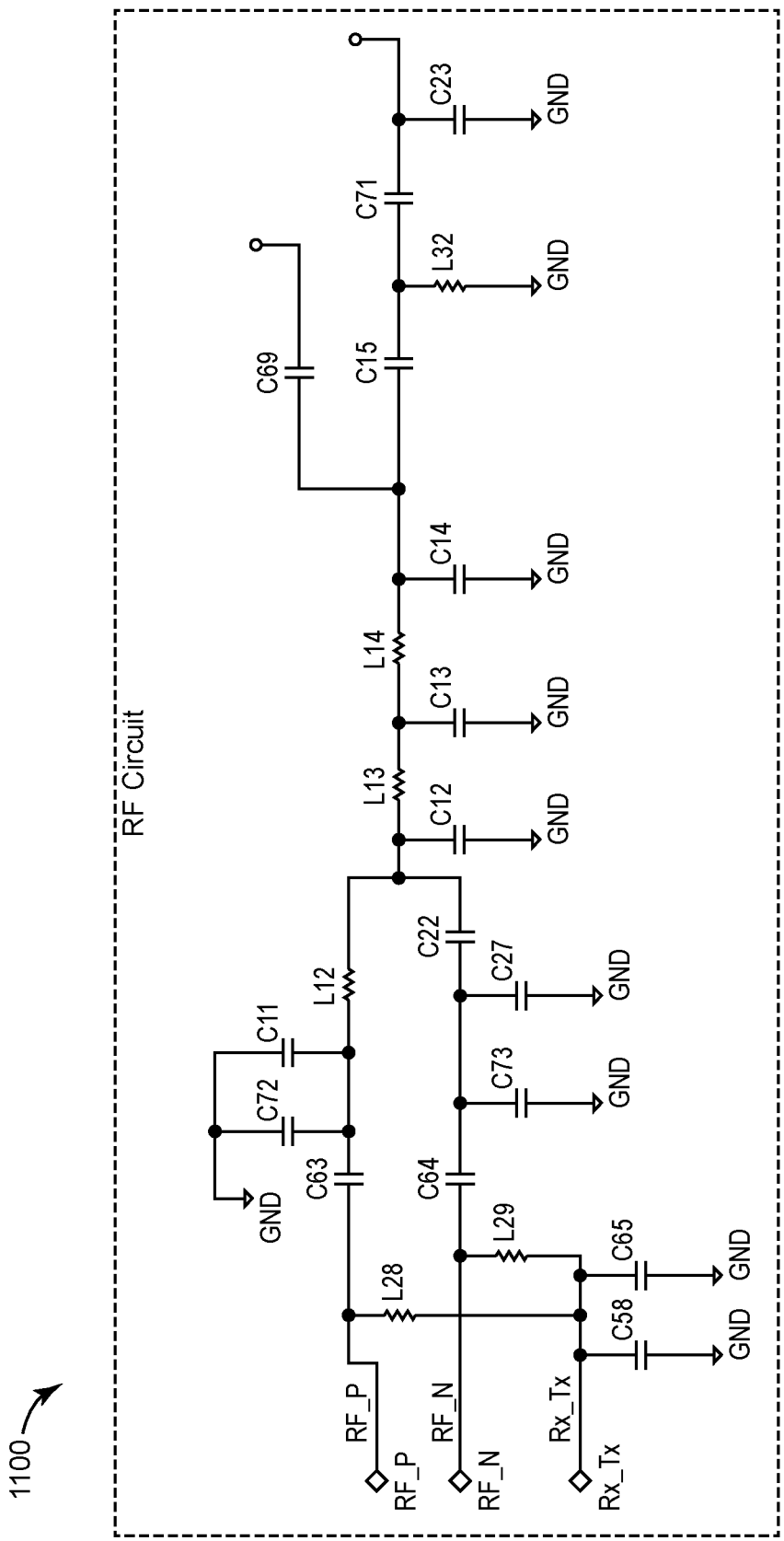
FIG. 11 is a schematic of a RF circuit used to wirelessly transmit data produced by a smart energy sensor, according to an exemplary embodiment.

Referring now to FIG. 11, a schematic 1100 of an RF circuit that can be included as a part of the communications interface 780 in a smart energy sensor 600 is shown according to one embodiment. According to various embodiments, the RF circuit can be designed to communicate over a sub-1 GHz frequency band. As described above, using the sub-1 GHz frequency range can provide several advantages including long range, low power consumption, low interference, and compatibility with IoT applications.

Figure 12:
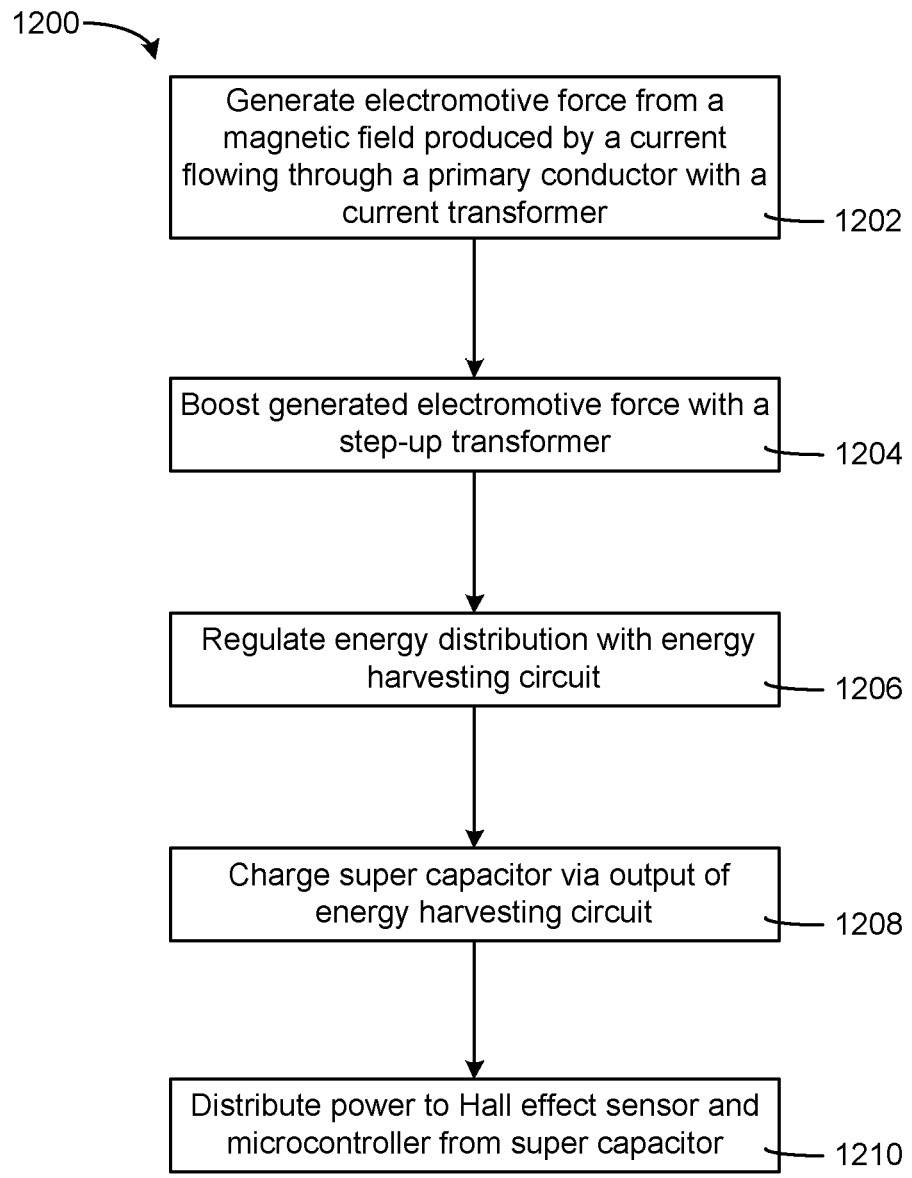
FIG. 12 is a flow diagram describing an energy harvesting feature of a smart energy sensor, according to an exemplary embodiment.

Referring now to FIG. 12, a flow diagram of an energy harvesting process 1200 is shown, according to an exemplary embodiment. Process 1200 can be performed by one or more wireless sensors 600 in a building control system. For example, process 1200 can be performed by a smart energy sensor 600 as described with reference to FIGS. 6-7. Process 1200 can allow a sensor 600 to be self-powered which eliminates the need for regular maintenance and cost associated with batteries.

Process 1200 is shown to include generating an electromotive force from a magnetic field produced by a current flowing through a primary conductor 610 using a power generating element (step 1202). The primary conductor 610 can be any conductor in a building control system. For example, the primary conductor 610 can be used to deliver electricity to HVAC equipment, lighting fixtures, or any other electric load. The power generating element can be a split core current transformer 722 as described with reference to FIG. 7. The current through the primary conductor 610 creates energy in the form of an induced electromotive force across the coils of the current transformer 722. This electric potential can be used to ultimately power the wireless sensor 600.

Process 1200 is shown to include boosting the generated electromotive force using a step-up transformer 724 (step 1204). In some embodiments, the ratio of turns in the secondary coils of the step-up transformer 724 to the turns in the primary coils is greater than one. A typical ratio of primary to secondary turns is 1:100. The energy produced in step 1202 from a primary conductor 610 is often a low-magnitude voltage. The step-up transformer 724 boosts this energy to a greater magnitude so it can be used as an input to an energy harvesting circuit 726 in future steps.

Process 1200 is shown to include regulating energy distribution using an energy harvesting circuit 726 (step 1206). The energy harvesting circuit 726 can be designed to take low voltage inputs (e.g., 20 mV) and provide a constant DC output voltage (e.g., 3.3V). The regulated output voltage can be used for different applications such as charging a capacitor 728. The energy harvesting circuit 726 can also be designed to produce a "power good" signal that indicates if the output voltage is at a required magnitude.

Process 1200 is shown to include charging a super capacitor via the output of the energy harvesting circuit 726 (step 1208). In some embodiments, the super capacitor is capacitor 728 as described with reference to FIG. 7. The super capacitor 728 typically has a large capacitance value (e.g., 470 µF). The super capacitor 728 can deliver energy faster and tolerate more charge/discharge cycle than a typical battery.

Process 1200 is shown to include distributing power to a current sensing element and a microcontroller 760 from the super capacitor 728 (step 1210). In some embodiments, the current sensing element is Hall effect sensor 742 as described with reference to FIG. 7. The ability to distribute energy from the super capacitor 728 allows a smart energy sensor 600 to be self-powered and eliminates the need for a battery or other power source.

Figure 13:
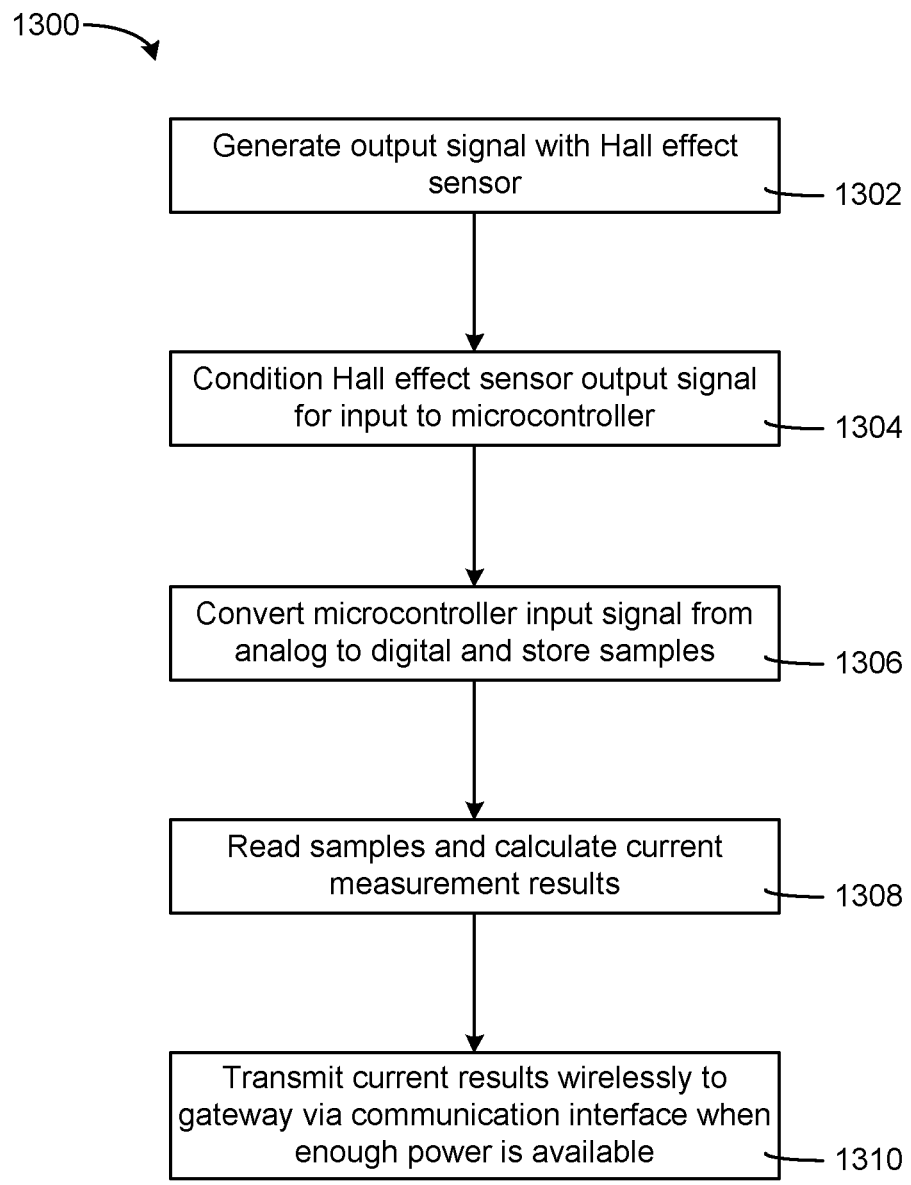
FIG. 13 is a flow diagram describing a current measurement feature of a smart energy sensor, according to an exemplary embodiment.

Referring now to FIG. 13, a flow diagram of a wireless current measurement process 1300 is shown, according to an exemplary embodiment. Process 1300 can be performed by one or more wireless sensors 600 in a building control system. For example, process 1300 can be performed by a smart energy sensor 600 as described with reference to FIGS. 6-7.

Process 1300 is shown to include generating an output signal with a current sensing element (step 1302). In some embodiments, the current sensing element is Hall effect sensor 742 as described with reference to FIG. 7. The output signal can respond linearly to a magnetic field created by a current flowing through a primary conductor 610. In some embodiments, the Hall effect sensor produces an analog output signal $V_{out}$ between 0V to 2V. The output signal $V_{out}$ from the Hall effect sensor 742 can ultimately be used to calculate a current measurement signal $y_i$ indicative of current flowing through the primary conductor 610.

Process 1300 is shown to include conditioning the Hall effect sensor output signal $V_{out}$ for input to a microcontroller (step 1304). As described above, signal conditioning may include amplification, filtering, or any other manipulation of the sensor output signal required for further processing by a microcontroller. The conditioned analog signal $y_a$ can be sent to a microcontroller such as controller 760 as described with reference to FIG. 7.

Process 1300 is shown to include converting an input signal $y_a$, from analog to digital and storing the digital signal $y_d$ samples (step 1306). In some embodiments, the conversion is performed by ADC 764 as described with reference to FIG. 7. The conversion can be performed using a specified sampling rate (i.e., number samples per second). The digital signal $y_d$ samples based on the Hall effect sensor output signal $V_{out}$ can be stored in a memory 770 and further processed according to firmware 774 logic.

Process 1300 is shown to include reading digital signal $y_d$ samples and calculating current measurement signal $y_i$ results (step 1308). In some embodiments, processor 762 performs this calculation as described above with reference to FIG. 7. The output signal $V_{out}$ data from the Hall effect sensor 742 can be converted to a magnetic field magnitude according to specifications provided by the Hall effect sensor 742 manufacturer. For example, a Hall effect sensor 742 output of 1.09V may correspond to a magnetic field of 0.1 mT. The magnitude of the magnetic field can be used to determine the magnitude of a current flowing through a primary conductor 610. For example, a magnetic field of 0.1 mT may correspond to a primary conductor 610 current of 5 A. Various approaches may be used to perform this current calculation, including arithmetic logic, lookup tables, etc.

Process 1300 is shown to include transmitting current measurement signal $y_i$ wirelessly to a gateway 520 via a communications interface 780 when enough power is available (step 1310). As described above with reference to FIG. 7, the current measurement signal $y_i$ data (and/or other sensor 600 data) can be sent over a Wi-Fi low power frequency range or a sub-1-GHz range.

Figure 14:
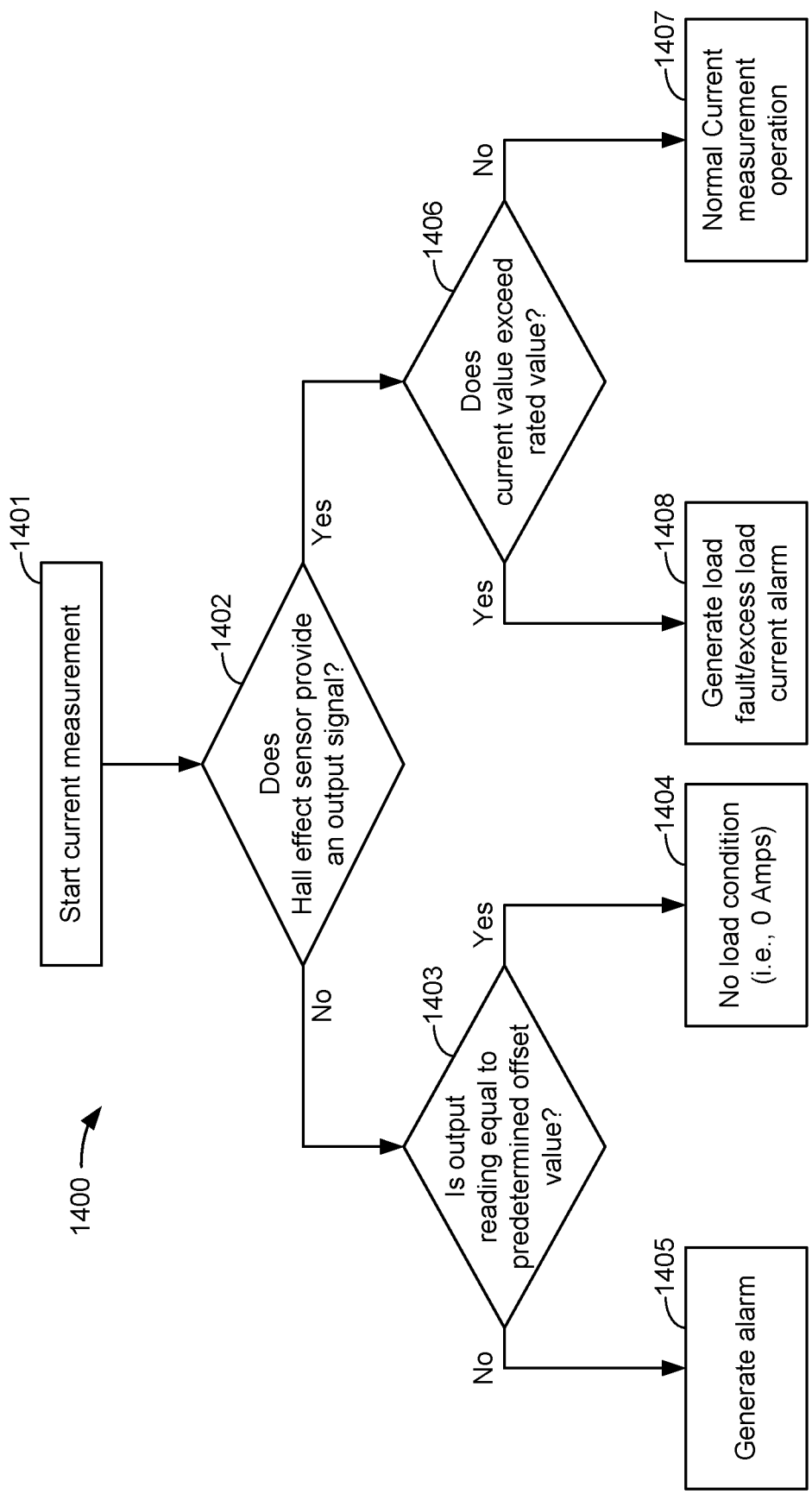
FIG. 14 is a flow diagram describing a fault detection feature for current sensing, according to an exemplary embodiment.
Figure 15:
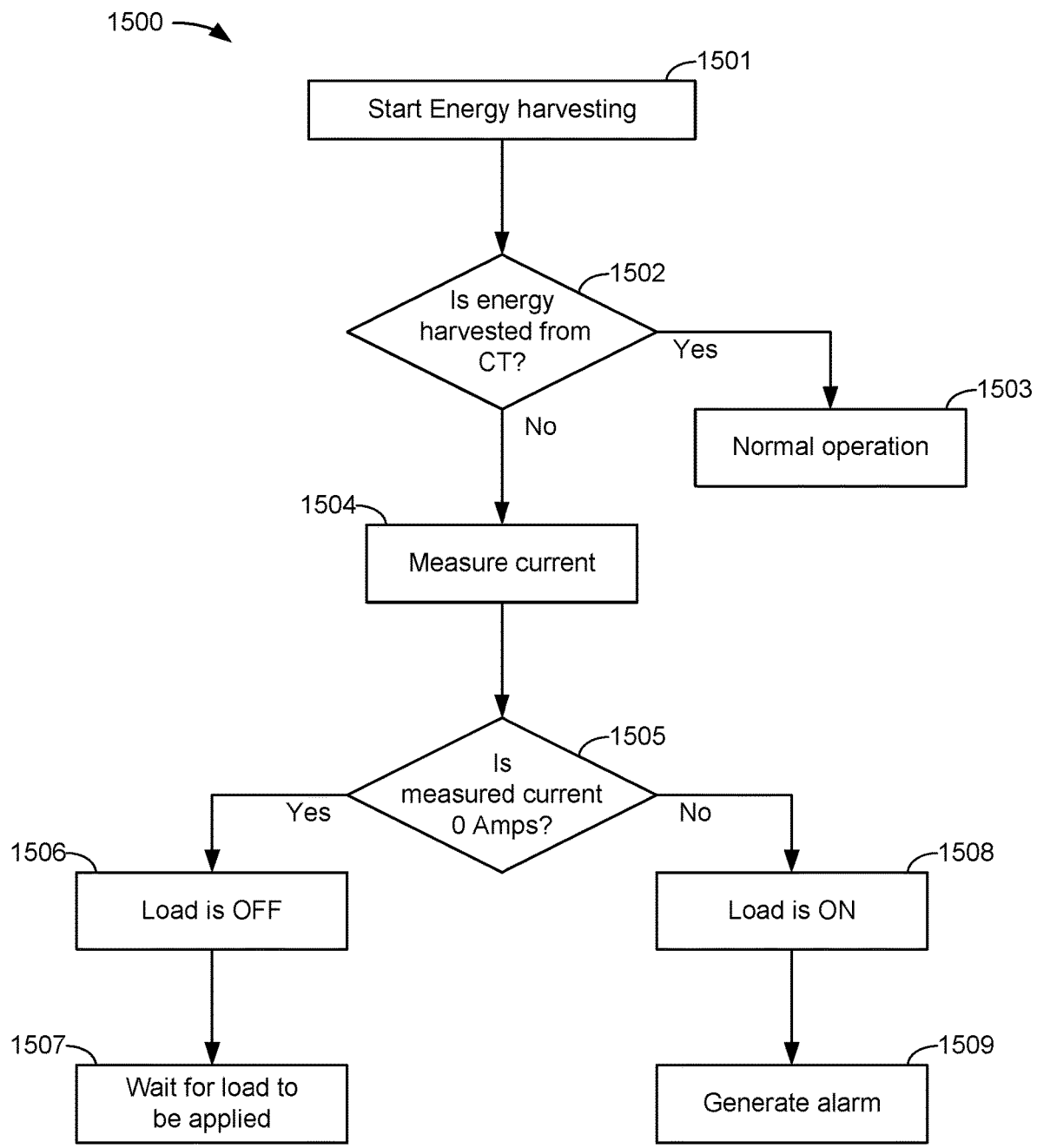
FIG. 15 is a flow diagram describing a fault detection feature for energy harvesting, according to an exemplary embodiment.

As illustrated in FIGS. 14 and 15, the sensor 600 may be configured to detect a fault in one or both of the ability of the sensor 600 to harvest energy and/or to measure current. Referring to FIG. 14, one embodiment of a process 1400 in which the sensor may be configured to detect a problem with the functioning of the current sensing element (e.g. a Hall effect sensor 742) and/or other component of the current measuring circuit 740 is shown.

As illustrated in FIG. 14 according to various embodiments, the fault detection process 1400 for the current measuring circuit 740 may be configured to avoid the uncertainties that would otherwise arise in response to a reading of zero by the current sensing element, avoid high current situations that would affect the accuracy of current measurements and/or that minimize the risk of subjecting he current sensing element and/or current measurement system 740 to damaging levels of current flow. Referring to FIG. 14, following the initiation of current measurement using the current measuring circuit 740 at step 1401, the output signal of the current sensing element is checked at step 1402.

As will be understood, without the incorporation of a current measurement circuit 720 fault detection process 1400, an output signal reading of zero by the current sensing element (such as, e.g., a $V_{out}$ reading of 0V by the Hall effect sensor 742) could be attributed to either a proper reading by the current sensing element of a no current flow state of the conductor 610 or such a reading of zero could be indicative of a fault in the current measurement circuit 742. To resolve such uncertainties related to a lack of signal output from the current sensing element, the fault detection process 1400 for the current measuring circuit 740 may be configured to "offset" output signal readings of the current sensing element (such as, e.g. $V_{out}$ readings by the Hall effect sensor 742) by a predetermined, non-zero offset amount (e.g. 1V).

Accordingly, as shown at step 1403, in response to no output from the current sensing element being detected at step 1402, a signal reading of the current sensing element is checked. In a no current flow state of the conductor 610, the current sensing element is configured to output a signal equal to the predetermined, non-zero offset amount (e.g. 1V) instead of outputting a reading of zero. Thus, if at step 1403 the signal reading of the current sensing element is determined to be equal to the predetermined, non-zero offset amount, at step 1404, the fault detection process 1400 confirms that the lack of signal output from the current sensing element is a proper reading corresponding to no load being applied to the conductor 610.

On the other hand, if at step 1403 the signal output reading of the current sensing element is determined to be less than the predetermined, non-zero offset amount, at step 1405 an alarm is generated, indicating to the sensor that there is a problem with the current sensing element and/or current measurement circuit 740.

In some embodiments of current measurement circuit 740, the current sensing element of the current measurement circuit 740 may provide inaccurate readings and/or may be susceptible to damage when exposed to high currents. Accordingly, as shown in step 1406, according to some embodiments, the fault detecting process 1400 may additionally, or alternatively, be configured to alert the sensor 600 to such excess current scenarios.

For example, if an output reading is detected by the current sensing element at step 1402, at step 1406 the faulting detection process 1400 may determine whether the detected output reading corresponds to a current value that exceeds the rated value of the current sensing element and/or other components of the current measurement circuit 740. At step 1407, the sensor continues its operation if the measured current is determined to be within a normal current range. Otherwise, at step 1408, in response to detecting that the current flow within the conduct 610 exceeds the rated value, the sensor 600 is alerted by the fault detection process 1400 of such a load fault condition.

Referring to FIG. 15, a fault detection process 1500 for the power generation circuit 720 is illustrated according to one embodiment. In response to energy harvesting using the power generation circuit 720 being initiated at step 1501, a determination as to whether energy is being harvested by the energy harvesting element (such as, e.g. a current transformer 722) is made at step 1502. If energy is being harvested, operation of the sensor is continued at step 1503.

Similar to the uncertainty that would otherwise be raised in response to a reading of zero by the current sensing element of the current measurement circuit 740, an indication at step 1502 that no energy is being harvested could be indicative of either a proper functioning of the power generation circuit 720 while no load is applied to the conductor 610, or the indication of a lack of energy being harvested could be indicative of a fault in the energy harvesting element and/or other component of the power generation circuit 720.

Accordingly, at step 1504, in response to a determination that no energy is being harvested, the fault detection process 1500 of the power generation circuit 720 in configured to determine whether current is flowing through the conductor 610. According to some embodiments, the current flow determination at step 1505 may optionally be made using the fault detection process 1400 embodiment illustrated in FIG. 14. As will be understood, according to some embodiments, energy previously harvested by the power generation circuit 740 and stored, e.g., in a super capacitor 728, may be utilized to provide the requisite power to determine whether current is flowing at step 1505.

As shown by step 1506, if no current flow is detected, system at step 1507 waits for a load to be applied to the conductor 610, at which point the power generation circuit 720 may begin harvesting energy. According to various embodiments, the sensor 600 may be configured to periodically redetermine whether energy is being harvested by repeating the steps of the fault detection process 1500.

On the other hand, if at step 1508 a current is determined to be flowing through the conductor 610, at step 1590 the sensor 600 is alerted to a problem with the energy harvesting element and/or the power generation circuit 720.

According to some embodiments, the sensor 600 may be configured to utilize a redundant current measurement circuit to increase the reliability of the current measurement provided by the current measurement circuit 740. For example, as noted above, in some embodiments, the energy harvesting circuit 720 includes an energy harvesting element comprising a current transformer 722. Accordingly, in some embodiments, the redundant current measurement circuit may utilize the current transformer 722 of the energy harvesting circuit 720 to obtain current flow measurements during those times when the current transformer 722 is not being utilized by the power generation circuit 720 to harvest energy. The current flow measured by the redundant current measurement circuit may then be compared to the current flow measured using the current measurement circuit 740 to verify the accuracy of the current measurement circuit 740. As will be understood, in such embodiments, although the redundant current measurement circuit would only be configured to measure current during periods of non-harvesting of energy using the current transform 722, the current sensing element of the current measurement circuit 740 would be configured to continuously and uninterruptedly detect current flow, even during the harvesting of energy using the current transformer 722.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An apparatus comprising:
   an energy harvesting element configured to mount around a power line and harvest energy from the power line in response to a load being applied to the power line;
   a sensing element configured to generate a signal in response to the load being applied to the power line and to generate no signal in response to no load being applied to the power line;
   a fault detecting circuit configured to generate an output based on the signal generated by the sensing element, the output generated by the fault detecting circuit corresponding to an offset version of the signal generated by the sensing element by applying an offset voltage to the signal, such that, in response to no load being applied to the power line, the output generated by the fault detecting circuit corresponds to a non-zero offset reading, wherein the fault detecting circuit determines whether the energy harvesting element or the sensing element are experiencing a fault based at least in part on the offset voltage; and
   a microcontroller configured to calculate a reading of current flow through the power line based on the signal generated by the sensing element;
   wherein at least one of the sensing element and the microcontroller is powered entirely and exclusively by the energy harvested by the harvesting element.

2. The apparatus of claim 1, wherein the signal generated by the sensing element is representative of a magnetic field generated by a load being applied to the power line.

3. The apparatus of claim 2, wherein the signal is a voltage signal.

4. The apparatus of claim 2, wherein the sensing element is a Hall effect sensor.

5. The apparatus of claim 1, further comprising a housing configured to be attached about a power line, wherein the energy harvesting element, the sensing element, the fault detecting circuit, and the microcontroller are each contained entirely within the housing.

6. The apparatus of claim 1, wherein the fault detecting circuit is configured to generate an alarm if the output generated by the fault detecting circuit is less than the non-zero offset reading.

7. The apparatus of claim 1, wherein the sensing element and the microcontroller are each powered exclusively and entirely by the energy harvested by the energy harvesting element.

8. A sensor comprising:
   a housing configured to be positioned about a power line;
   a power generation circuit configured to harvest energy from the power line in response to a load applied to the power line;
   a current measurement circuit configured to detect a load applied to the power line and generate a signal corresponding to the detected load, the generated signal being offset from the detected load by a predetermined non-zero amount by applying an offset voltage to the signal, such that when no load is applied to the power line, the signal generated by the current measurement circuit corresponds to a non-zero offset reading; and
   a processor configured to calculate current flowing through the power line based on the signal generated by the current measurement circuit, wherein the processor is configured to determine whether the current measurement circuit or the sensing element are experiencing a fault based at least in part on the offset voltage;
   wherein an energy harvesting element of the power generation circuit, a sensing element of the current measurement circuit, and the processor are each entirely contained within the housing.

9. The sensor of claim 8, wherein the energy harvesting element comprises a current transformer.

10. The sensor of claim 8, wherein the sensing element is configured to detect a magnetic field generated by a load being applied to the power line.

11. The sensor of claim 10, wherein the sensing element comprises a Hall effect sensor.

12. The sensor of claim 8, further comprising a capacitor stored within the housing, the capacitor being configured to store energy harvested by the harvesting element.

13. The sensor of claim 8, further comprising an alarm configured to generate a current measurement warning if the signal generated by the current measurement circuit is less than the non-zero offset reading.

14. The sensor of claim 8, wherein the power generation circuit is configured to generate an alarm in response to detecting no energy being harvested by the harvesting element and in response to determining that the signal generated by the current measurement circuit is greater than or equal to the non-zero offset reading.

15. A method of measuring current flow through a conductor comprising:
   utilizing a harvesting element to non-invasively harvest energy from a conductor to which a load has been applied;
   utilizing a sensing element to non-invasively generate a signal responsive to the load applied to the conductor, wherein the sensing element is configured to generate a non-zero offset reading in response to no load being applied to the conductor;
   generating a first alarm in response to the sensing element generating a signal that is less than the non-zero offset reading;
   generating a second alarm in response to no energy being harvested by the harvesting element and a generated sensing element signal that is greater than or equal to the non-zero offset reading; and
   if no first alarm is generated, processing, by a microcontroller, the signal generated by the sensing element to determine current flow through the conductor.

16. The method of claim 15, further comprising storing at least a portion of the energy harvested by the harvesting element within a capacitor operably connected to the harvesting element.

17. The method of claim 15, wherein the signal generated by the sensing element is based on a measurement of a magnetic field resulting from the load applied to the conductor.

18. The method of claim 15, wherein the harvesting element comprises a current transformer and the sensing element comprises a Hall effect sensor.

19. The method of claim 18, wherein the current transformer, the Hall effect sensor, and the microcontroller are each entirely contained within a sensor housing configured to be placed around the conductor.

20. The method of claim 19, wherein the Hall effect sensor and the microcontroller are ach powered entirely and exclusively by the energy harvested by the current transformer.

\* \* \* \* \*